United States Patent
Lu

(10) Patent No.: US 12,080,704 B2
(45) Date of Patent: *Sep. 3, 2024

(54) MEMORY CELL ARRAY AND METHOD OF OPERATING SAME

(71) Applicant: TAIWAN SEMICONDUCTOR MANUFACTURING COMPANY, LTD., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/295,134

(22) Filed: Apr. 3, 2023

(65) Prior Publication Data

US 2023/0246018 A1    Aug. 3, 2023

Related U.S. Application Data

(63) Continuation of application No. 17/122,652, filed on Dec. 15, 2020, now Pat. No. 11,621,258, which is a
(Continued)

(51) Int. Cl.
*G11C 11/418* (2006.01)
*G11C 11/412* (2006.01)
(Continued)

(52) U.S. Cl.
CPC ........ *H01L 27/0207* (2013.01); *G11C 11/412* (2013.01); *G11C 11/418* (2013.01);
(Continued)

(58) Field of Classification Search
CPC .... G11C 11/419; G11C 11/418; G11C 11/412
(Continued)

(56) References Cited

U.S. PATENT DOCUMENTS 5,453,950 A * 9/1995 Voss ............... G11C 11/412
365/174
6,181,640 B1   1/2001 Kang
(Continued)

FOREIGN PATENT DOCUMENTS

CN    104900256    9/2015
TW    201539445    10/2015

OTHER PUBLICATIONS

Ingvar Carlson et al., "A High Density, Low Leakage, 5T SRAM for Embedded Caches", IEEE (2004), 0-7803-8480-6/04/2004; pp. 215-218.
(Continued)

*Primary Examiner* — Sung Il Cho
(74) *Attorney, Agent, or Firm* — Hauptman Ham, LLP

(57) ABSTRACT

A memory circuit includes a first and a second bit line, a first and a second inverter, a P-type pass gate transistor, a pre-charge circuit, a first transmission gate and a sense amplifier. The P-type pass gate transistor is coupled between the first storage node and the first bit line. The pre-charge circuit is coupled to at least the first bit line or the second bit line, and configured to charge at least the first or second bit line to a pre-charge voltage responsive to a first signal. The pre-charge voltage is between a voltage of a first logical level and a voltage of a second logical level. The first transmission gate is coupled to the first bit line, and configured to receive a first and a second control signal. The sense amplifier is coupled to the first bit line by the first transmission gate.

20 Claims, 8 Drawing Sheets

Related U.S. Application Data continuation of application No. 16/383,289, filed on Apr. 12, 2019, now Pat. No. 10,872,883.

(60) Provisional application No. 62/660,834, filed on Apr. 20, 2018.

(51) Int. Cl.
  *G11C 11/419* (2006.01)
  *H01L 27/02* (2006.01)
  *H10B 10/00* (2023.01)

(52) U.S. Cl.
  CPC ............ *G11C 11/419* (2013.01); *H10B 10/00* (2023.02); *H10B 10/12* (2023.02)

(58) Field of Classification Search
  USPC ........................................................ 365/156
  See application file for complete search history.

(56) References Cited

U.S. PATENT DOCUMENTS

| | | | |
|---|---|---|---|
| 9,257,172 B2 | 2/2016 | Fujiwara | |
| 9,299,404 B1 | 3/2016 | Ch'ng et al. | |
| 9,679,619 B2 | 6/2017 | Hsieh et al. | |
| 9,787,176 B2 | 10/2017 | Dong et al. | |
| 9,875,788 B2 | 1/2018 | Jung | |
| 10,446,223 B1 | 10/2019 | Nebesnyi | |
| 10,872,883 B2 | 12/2020 | Lu | |
| 2002/0020886 A1 | 2/2002 | Rockett | |
| 2003/0035331 A1 | 2/2003 | Foss et al. | |
| 2004/0130933 A1* | 7/2004 | Kanehara | G11C 11/419 |
| | | | 365/154 |
| 2006/0209606 A1 | 9/2006 | Rajwani | |
| 2007/0058448 A1 | 3/2007 | Joshi et al. | |
| 2007/0091700 A1 | 4/2007 | Takeda | |
| 2010/0296334 A1* | 11/2010 | Houston | G11C 11/412 |
| | | | 365/189.14 |
| 2011/0085391 A1* | 4/2011 | Chandra | G11C 7/02 |
| | | | 365/210.1 |
| 2011/0149661 A1 | 6/2011 | Rajwani | |
| 2014/0140157 A1 | 5/2014 | Huott et al. | |
| 2015/0063007 A1 | 3/2015 | Choi | |
| 2015/0117120 A1 | 4/2015 | Barth, Jr. et al. | |
| 2015/0248927 A1 | 9/2015 | Fujiwara et al. | |
| 2015/0348598 A1 | 12/2015 | Wang et al. | |
| 2016/0247555 A1* | 8/2016 | Nguyen | G11C 11/419 |
| 2016/0268893 A1 | 9/2016 | Dong et al. | |
| 2016/0372180 A1* | 12/2016 | Amara | G11C 11/412 |
| 2018/0342292 A1 | 11/2018 | Ishii | |

OTHER PUBLICATIONS

Office Action dated Jun. 25, 2020 from corresponding application No. KR 10-2019-0046364.
Office Action dated Sep. 24, 2020 for corresponding case No. CN 10-4900256 A. (pp. 1-12).

* cited by examiner

MEMORY CELL ARRAY AND METHOD OF OPERATING SAME

PRIORITY CLAIM AND CROSS-REFERENCE

This application is a continuation of U.S. application Ser. No. 17/122,652, filed Dec. 15, 2020, now U.S. Pat. No. 11,621,258 issued Apr. 4, 2023, which is a continuation of U.S. application Ser. No. 16/383,289, filed Apr. 12, 2019, now U.S. Pat. No. 10,872,883 issued Dec. 22, 2020, which claims the benefit of U.S. Provisional Application No. 62/660,834, filed Apr. 20, 2018, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. For example, in some applications, a cache is a particular memory macro that can be used on an IC chip. Furthermore, in some applications, cache can be configured to store recently used data such that subsequent accesses of recent data can be implemented by accessing the cache as opposed to accessing memory located off of the IC chip (i.e., off-chip). In general, a larger cache allows a larger amount of recent data to be stored on-chip resulting in less off-chip memory data access. The design of smaller memory cells enables denser IC's and speeds up overall IC performance. Therefore, alternatives to 6-transistor (6T) static random access memory (SRAM) are desired.

BRIEF DESCRIPTION OF THE DRAWINGS

The patent or application file contains drawings/photographs executed in color. Copies of this patent with color drawing(s)/photograph(s) will be provided by the Office upon request and payment of the necessary fee.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
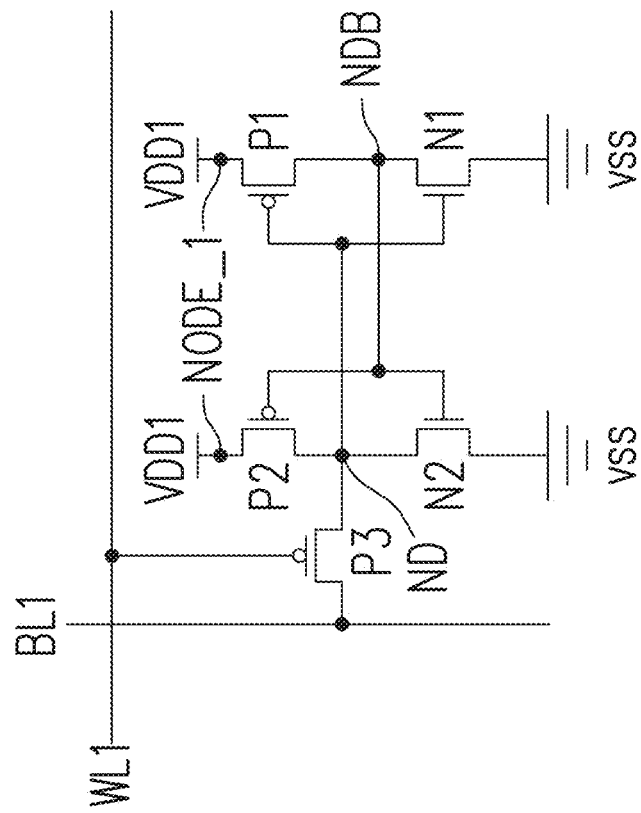
FIG. 1 is a circuit diagram of a memory cell, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first word line, a first bit line, a second bit line, a first inverter, a second inverter, a P-type pass gate transistor and a pre-charge circuit. The first inverter is coupled to a first storage node. The second inverter is coupled to the first storage node and the first inverter. The P-type pass gate transistor is coupled between the first storage node and the first bit line. The P-type pass gate transistor is coupled to the first word line, the first inverter and the second inverter. The pre-charge circuit is coupled to the first bit line or the second bit line. The pre-charge circuit is configured to charge the first bit line or the second bit line to a pre-charge voltage responsive to a first signal. The pre-charge voltage is between a voltage of a first logical level and a voltage of a second logical level.

In some embodiments, the first inverter, the second inverter and the P-type pass gate transistor are part of a (5T) static random access memory (SRAM) memory cell which results in smaller memory cell sizes than other designs. In some embodiments, the second bit line is not coupled to the memory cell while the first bit line is coupled to the memory cell.

In some embodiments, the pre-charge circuit is at least an n-type transistor. In some embodiments, pre-charging the first bit line and the second bit line to the pre-charge voltage by at least the n-type transistor results in a natural pre-charge voltage level compared with other approaches that have pre-charge voltage levels generated from using a P-type transistor or with additional circuitry. In some embodiments, a natural pre-charge voltage level is a voltage generated without additional pre-charge circuitry.

In some embodiments, the memory circuit further includes a sense amplifier. In some embodiments, the second bit line is used as a reference bit line (BL) for the sense amplifier when reading data stored in the memory cell through the first bit line (BL) after pre-charging. In some embodiments, by using the second bit line as the reference bit line, the sense amplifier is implemented with a differential sensing configuration resulting in a faster sensing time and a lower signal to noise ratio than other approaches.

In some embodiments, using the p-type transistor in the memory cell allows a p-type transistor in the latch of the memory cell to pull the first bit line to a supply voltage during a read operation resulting in a larger bit line split between the first and second bit line and causing the sense amplifier to better sense the written data than other approaches, and the memory cell does not utilize an additional voltage to pre-charge the second bit line compared with other approaches.

Memory Cell

FIG. 1 is a circuit diagram of a memory cell 100, in accordance with some embodiments.

Memory cell 100 is a five transistor (5T) single port (SP) static random access memory (SRAM) memory cell used for illustration. In some embodiments, memory cell 100 employs a number of transistors other than five. Other types of memory are within the scope of various embodiments.

Memory cell 100 comprises three P-type metal oxide semiconductor (PMOS) transistors P1, P2 and P3, and two N-type metal oxide semiconductor (NMOS) transistors N1 and N2. Transistors P1, P2, N1, and N2 form a cross-latch or a pair of cross-coupled inverters. For example, PMOS transistor P1 and NMOS transistor N1 form the first inverter while PMOS transistor P2 and NMOS transistor N2 form the second inverter.

A source terminal of each of PMOS transistors P1 and P2 are configured as a voltage supply node NODE_1. Each voltage supply node NODE_1 is coupled to a first voltage source VDDI. A drain terminal of PMOS transistor P1 is coupled with a drain terminal of NMOS transistor N1, a gate terminal of PMOS transistor P2, a gate terminal of NMOS transistor N2, and is configured as a storage node NDB.

A drain terminal of PMOS transistor P2 is coupled with a drain terminal of NMOS transistor N2, a gate terminal of PMOS transistor P1, a gate terminal of NMOS transistor N1, a source terminal of PMOS transistor P3, and is configured as a storage node ND. A source terminal of each of NMOS transistors N1 and N2 is configured as a supply reference voltage node (not labelled) configured to receive a supply reference voltage VSS. The source terminal of each of NMOS transistors N1 and N2 is also coupled to supply reference voltage VSS.

A word line WL1 is coupled with a gate terminal of PMOS transistor P3. Word line WL1 is also called a write control line because PMOS transistor P3 is configured to be controlled by a signal on word line WL1 in order to transfer data between bit line BL1 and node ND.

A drain terminal of PMOS transistor P3 is coupled to a bit line BL1. Bit line BL1 is configured as both data input and output for memory cell 100. In some embodiments, in a write operation, applying a logical value to a bit line BL1 enables writing the logical value on the bit line BL1 to memory cell 100. Bit line BL1 is called a data line because the data carried on bit line BL1 is written to and read from node ND. In various embodiments, different from the above embodiments, the source terminal of PMOS transistor P3 is coupled to the bit line BL1, and the drain terminal of PMOS transistor P3 is coupled to the storage node ND.

Memory Cell Array

Figure 2:
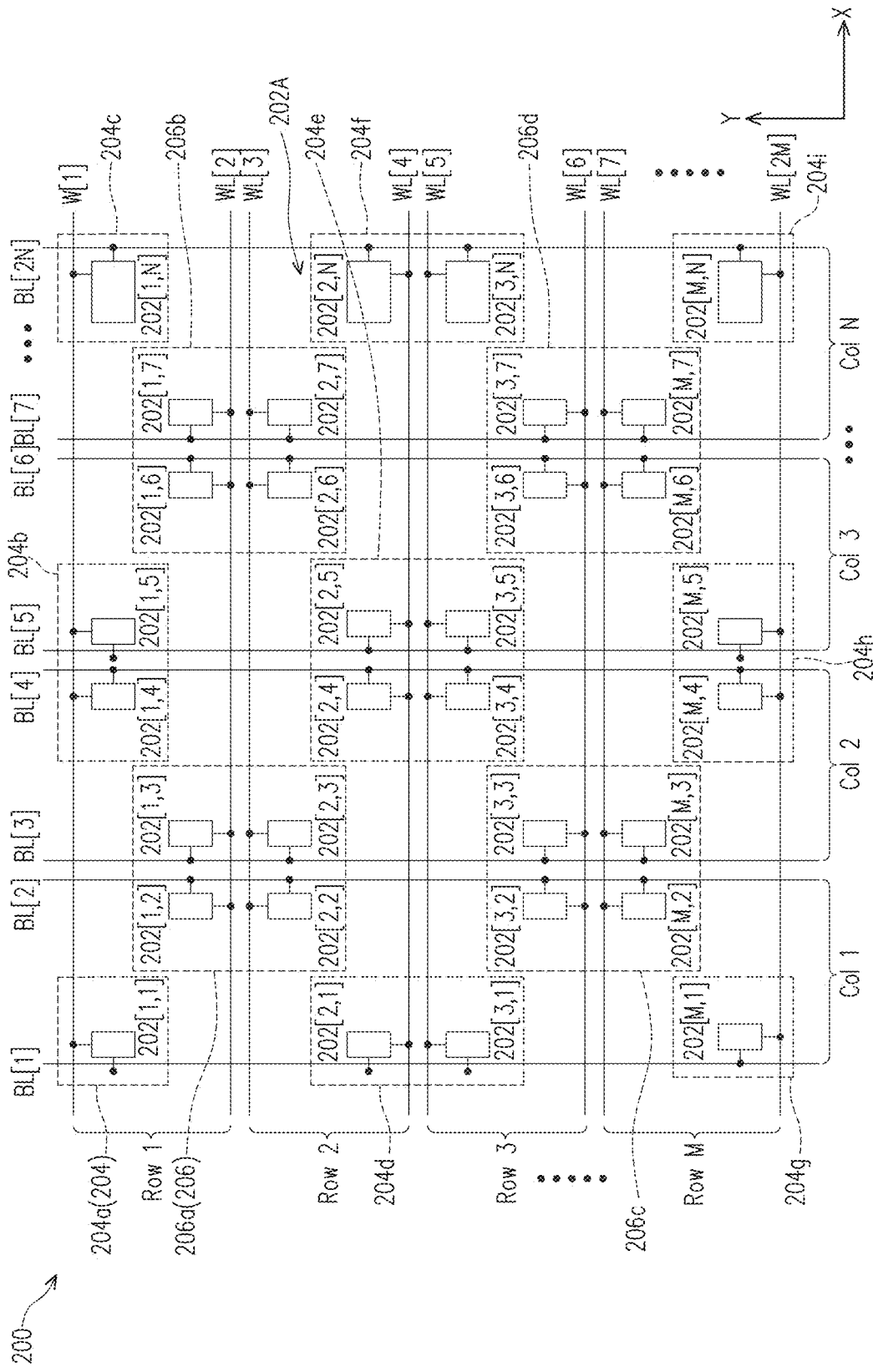
FIG. 2 is a block diagram of a memory cell array having a plurality of memory cells in FIG. 1, in accordance with some embodiments.

FIG. 2 is a block diagram of a memory cell array 200 having a plurality of memory cells in FIG. 1, in accordance with some embodiments. For example, memory cell 100 of FIG. 1 is usable as one or more memory cells in memory cell array 200.

Memory cell array 200 comprises an array of memory cells 202[1,1], 202[1,2], . . . , 202[2,2], . . . , 202[M,N] (collectively referred to as "array of memory cells 202A") having M rows and N columns, where N is a positive integer corresponding to the number of columns in array of memory cells 202A and M is a positive integer corresponding to the number of rows in array of memory cells 202A. The rows of cells in array of memory cells 202A are arranged in a first direction X. The columns of cells in array of memory cells 202A are arranged in a second direction Y. The second direction Y is different from the first direction X. In some embodiments, the second direction Y is perpendicular to the first direction X. Memory cell 100 of FIG. 1 is usable as one or more memory cells in array of memory cells 202A.

Memory cell array 200 further includes 2N bit lines BL[1], . . . BL[2N] (collectively referred to as "bit line BL"). Each column 1, . . . , N in array of memory cells 202A is overlapped by a pair of bit lines BL[1], . . . , BL[2N]. Each bit line BL extends in the second direction Y and is over a column of cells (e.g., column 1, . . . , N). In some embodiments, memory cell array 200 does not include one or more bit line bars BLB. Note that the term "bar" as used in this context indicates a logically inverted signal, for example, bit line bar BLB[1], . . . BLB[N] carries a signal logically inverted from a signal carried by bit line BL[1], . . . BL[N].

A bit line of the set of bit lines BL in array of memory cells 202A corresponds to bit line BL[1] of FIG. 1.

In some embodiments, a pair of memory cells of array of memory cells 202A are positioned between a pair of bit lines of bit lines BL. For example, in row 1 and column 1 of memory cell array 200, memory cell 202[1,1] and memory cell 202[1,2] are each positioned between bit line BL[1] and BL[2]. Similarly, in row 1 and column 2 of memory cell array 200, memory cell 202[1,3] and memory cell 202[1,4] are each positioned between bit line BL[3] and BL[4].

Memory cell array 200 further includes 2M word lines WL[1], . . . WL[2M] (collectively referred to as "word line WL"). Each word line WL extends in the first direction X and is over a row of cells (e.g., row 1, . . . , M). Each row 1, . . . , M in array of memory cells 202A is overlapped by a pair of word lines WL[1], . . . , WL[2M]. For example, word line WL[1] and WL[2] each overlap row 1 of array of memory cells 202A. Similarly, word line WL[3] and WL[4] each overlap row 2 of array of memory cells 202A and word line WL[7] and WL[2M] each overlap row M of array of memory cells 202A.

A word line of the set of word lines WL in array of memory cells 202A corresponds to word line WL[1] of FIG. 1.

In some embodiments, each row of memory cells of array of memory cells 202A is positioned between a pair of word lines of word lines WL. For example, in row 1 of memory cell array 200, memory cells 202[1,1], 202[1,2], . . . , 202[1,N] are positioned between word lines WL[1] and WL[2]. Similarly, in row 2 of memory cell array 200, memory cells 202[2,1], 202[2,2], . . . , 202[2,N] are positioned between word lines WL[3] and WL[4].

Each memory cell in the array of memory cells 202A is coupled to a corresponding bit line of bit lines BL and a corresponding word line of word lines WL. For example, memory cell 202[1,1] is coupled to bit line BL[1] and word line WL[1]. Similarly, memory cell 202[1,2] is coupled to bit line BL[2] and word line WL[2], memory cell 202[1,3] is coupled to bit line BL[3] and word line WL[2], memory cell 202[2,1] is coupled to bit line BL[1] and word line WL[4], and memory cell 202[2,2] is coupled to bit line BL[2] and word line WL[3]. During a read or write operation of a single memory cell of array of memory cells 202A in a row, a single word line WL coupled to the read or written memory cell is activated by a corresponding word line signal, and the remaining word lines are deactivated by corresponding word line signals. For example, during a read or write operation of memory cell 202[1,1] in row 1, word line WL[1] is activated by the corresponding word line signal, and the remaining word lines WL[2], WL[3], . . . , WL[2M] are deactivated by corresponding word line signals. In other words, for a read or write operation, a single memory cell is accessed by the corresponding word line for one row of cells. Similarly, during a write operation of the single memory cell of array of memory cells 202A in a column and a row, a single bit line BL coupled to the written to memory cell is utilized to write data by a corresponding bit line signal, and the remaining bit lines are not utilized by corresponding bit line signals. For example, during a write operation of memory cell 202[1,1] in row 1 and column 1, bit line BL[1] has a corresponding bit line signal for writing data to memory cell 202[1,1], and the remaining bit lines BL[2], BL[3], . . . , BL[2N] are not driven by corresponding bit line signals. In other words, for a write operation, a single memory cell is accessed by the corresponding word line for one row of cells and a corresponding bit line for one column of cells. Similarly, during a read operation of the single memory cell of array of memory cells 202A in a column and a row, a bit line BL coupled to the written to memory cell and a bit line adjacent to bit line BL are utilized to read data by corresponding bit line signals, and the remaining bit lines are not utilized. For example, during a read operation of memory cell 202[1,1] in row 1 and column 1, bit line BL[1] and adjacent bit line BL[2] and the corresponding bit line signals are used to read data from memory cell 202[1,1], and the remaining bit lines BL[3], . . . , BL[2N] are not utilized. In other words, for a read operation, a single memory cell is accessed by the corresponding word line for one row of cells and a pair of bit lines for one column of cells. In this example, the adjacent bit line BL[2] is used as a reference bit line to sense or read data stored in memory cell 302[1,1] through bit line BL[1].

Memory cells of the array of memory cells 202A are grouped into a first set of memory cells 204 and a second set of memory cells 206.

The first set of memory cells 204 includes memory cell groups 204a, 204b, . . . , 204i.

The second set of memory cells 206 includes memory cell groups 206a, 206b, 206c and 206d. Other numbers of memory cells within memory cell groups 204a, 204b, . . . , 204i, 206a, 206b, . . . , 206d are within the contemplated scope of the present disclosure.

In some embodiments, one or more memory cells of memory cell array 200 includes one or more single port (SP) SRAM cells. In some embodiments, one or more memory cells of memory cell array 200 includes one or more dual port (DP) or two port (2P) SRAM cells. In some embodiments, a DP SRAM cell is configured with two ports, each port being configured for simultaneous writing of data to the DP SRAM cell or reading of data from the DP SRAM cell. In some embodiments, a 2P SRAM cell is configured with a write port for writing data to the 2P SRAM cell, and a read port for reading data from the 2P SRAM cell. Different types of memory cells in memory cell array 200 are within the contemplated scope of the present disclosure. Different configurations of array of memory cells 202A are within the contemplated scope of the present disclosure. Different configurations of bit lines BL or word lines WL in array of memory cells 202A are within the contemplated scope of the present disclosure.

In some embodiments, memory cell array 200 includes an array of 5T SRAM cells (FIG. 1) causing memory cell array 200 to include less transistors than other memory cell arrays. In some embodiments, by memory cell array 200 including less transistors, memory cell array 200 occupies less area than other memory cell arrays. In some embodiments, by occupying less area than other memory cell arrays, memory cell array 200 is denser and has a larger memory capacity compared with other approaches.

Memory Circuit

Figure 3:
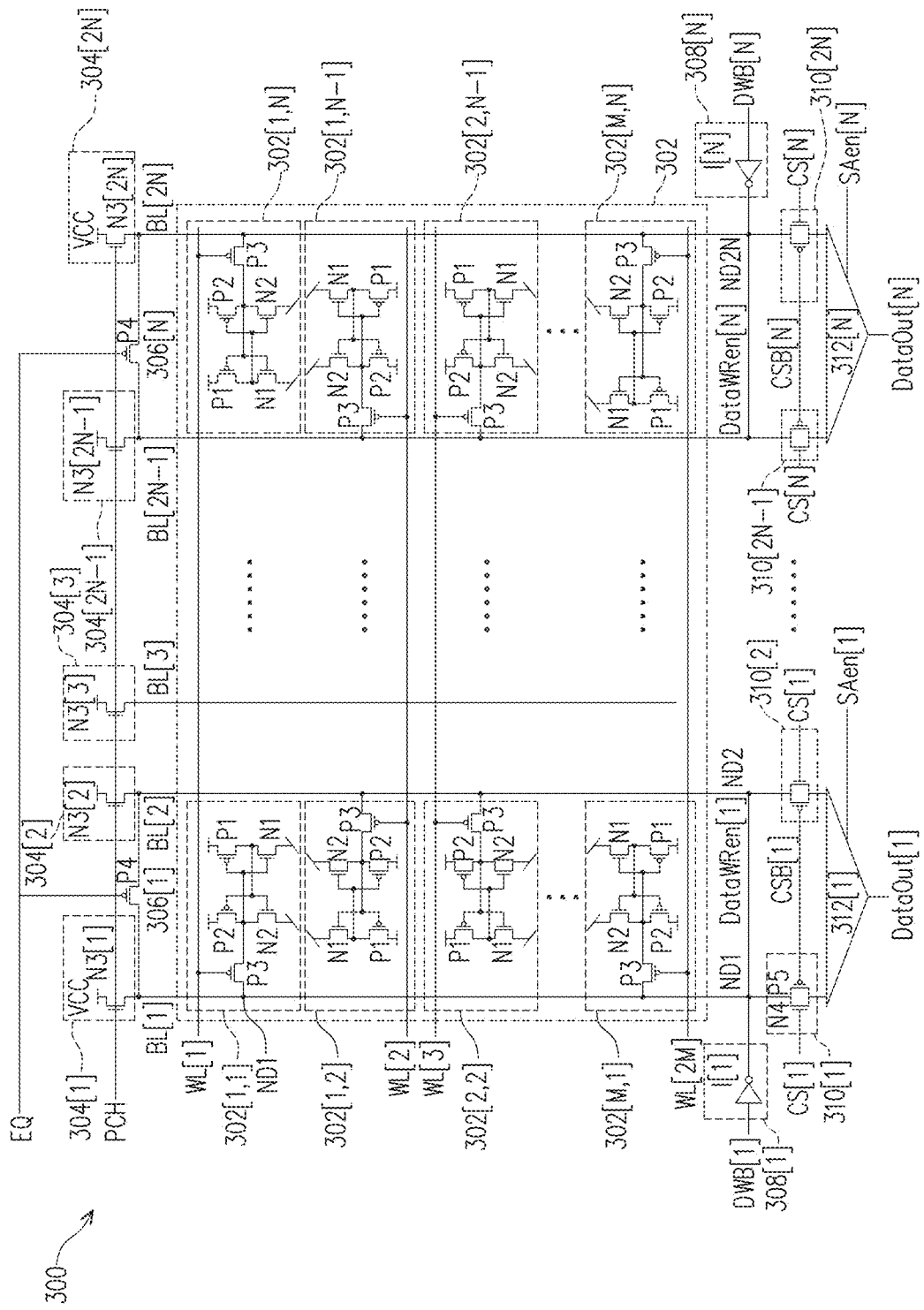
FIG. 3 is a circuit diagram of a memory circuit, in accordance with some embodiments.

FIG. 3 is a circuit diagram of a memory circuit 300, in accordance with some embodiments. Memory circuit 300 is an embodiment of the block diagram of memory cell array 200 of FIG. 2 expressed in a circuit diagram.

In comparison with memory cell array 200 of FIG. 2, memory circuit 300 further includes a set of pre-charge circuits 304, a set of equalization circuits 306, a set of write driver circuits 308 and a set of transmission gate circuits 310.

In comparison with memory cell array 200 of FIG. 2, memory cell array 302 replaces memory cell array 200 of FIG. 2. Components that are the same or similar to those in one or more of FIGS. 1-4 are given the same reference numbers, and detailed description thereof is thus omitted.

Memory circuit 300 includes a set of bit lines BL and a set of word lines WL coupled to an array of memory cells 302[1,1], 302[1,2], . . . , 302[2,2], . . . , 302[M,N] (collectively referred to as "memory cell array 302") having M rows and N columns.

Memory cell array 302 is similar to memory cell array 200 of FIG. 2, and similar detailed description is therefore omitted. For example, memory cell array 302 is memory cell array 200 of FIG. 2 including memory cell 100 of FIG. 1 being usable as the array of memory cells in memory cell array 302. The set of bit lines BL is similar to the set of bit lines BL of FIG. 2, and similar detailed description is therefore omitted. The set of word lines WL is similar to the set of word lines WL of FIG. 2, and similar detailed description is therefore omitted.

In comparison with memory cell array 200 of FIG. 2, memory cell array 302 replaces array of memory cells 202A of FIG. 2. Memory cell array 302 is an embodiment of the array of memory cells 202A of FIG. 2. Each memory cell 302[1,1], 302[1,2] . . . , 302[M,N] in memory cell array 302 is an embodiment of a corresponding memory cell 202[1,1], 202[1,2] . . . , 202[M,N] in the array of memory cells 202A.

Each memory cell in memory cell array 302 corresponds to memory cell 100 of FIG. 1. For example, each memory cell in memory cell array 302 comprises PMOS transistor P3, PMOS transistor P1, PMOS transistor P2, NMOS transistor N1 and NMOS transistor N2.

The set of pre-charge circuits 304 includes one or more pre-charge circuits 304[1], 304[2], . . . , 304[2N]. The set of pre-charge circuits 304 is coupled to the memory cell array 302 by the set of bit lines BL.

Each pre-charge circuit 304[1], 304[2], . . . , 304[2N] of the set of pre-charge circuits 304 is coupled to a corresponding bit line BL[1], BL[2], . . . , BL[2N] of the set of bit lines BL. For example, in some embodiments, pre-charge circuit 304[1] is coupled to bit line BL[1], and pre-charge circuit 304[2] is coupled to bit line BL[2]. Each pre-charge circuit 304[1], 304[2], . . . , 304[2N] of the set of pre-charge circuits 304 is coupled to a supply voltage Vcc. In some embodiments, at least one pre-charge circuit 304[1], 304[2], . . . , 304[2N] of the set of pre-charge circuits 304 is coupled to a supply voltage different from the supply voltage Vcc.

Each pre-charge circuit 304[1], 304[2], . . . , 304[2N] of the set of pre-charge circuits 304 is configured to receive a pre-charge signal PCH. In some embodiments, at least one pre-charge circuit 304[1], 304[2], . . . , 304[2N] of the set of pre-charge circuits 304 is configured to receive a pre-charge signal different from the pre-charge signal PCH.

Each pre-charge circuit 304[1], 304[2], . . . , 304[2N] of the set of pre-charge circuits 304 is coupled to and configured to charge a corresponding bit line BL[1], BL[2], . . . , BL[2N] of the set of bit lines BL to a pre-charge voltage Vpc responsive to the pre-charge signal PCH. For example, pre-charge circuit 304[1] is coupled to bit line BL[1] and is therefore configured to charge bit line BL[1] to the pre-charge voltage Vpc responsive to the pre-charge signal PCH. Similarly, pre-charge circuit 304[2] is coupled to bit line BL[2] and is therefore configured to charge bit line BL[2] to the pre-charge voltage Vpc responsive to the pre-charge signal PCH.

In some embodiments, the pre-charge voltage Vpc is between a voltage of a first logical level "0" and a voltage of a second logical level "1". In some embodiments, the pre-charge voltage Vpc is equal to the supply voltage Vcc minus a threshold voltage Vth (Vcc−Vth) of the corresponding coupled pre-charge circuit 304[1], 304[2], . . . , 304[2N] of the set of pre-charge circuits 304. In some embodiments, the pre-charge voltage Vpc corresponds to a voltage of logical high value "1" or a logical low value "0". In some embodiments, the pre-charge voltage Vpc corresponds to a value of a supply voltage Vcc, or a reference voltage VSS.

In some embodiments, the threshold voltage Vth of the corresponding pre-charge circuit 304[1], 304[2], . . . , 304[2N] is the corresponding threshold voltage Vth of the corresponding NMOS transistor N3[1], N3[2], . . . , N3[2N]. In some embodiments, the threshold voltage Vth of an NMOS transistor N3[1], N3[2], . . . , N3[2N] is different from another threshold voltage Vth of another NMOS transistor N3[1], N3[2], . . . , N3[2N] or a threshold voltage of PMOS transistor P3 in a corresponding memory cell. In some embodiments, the threshold voltage Vth of an NMOS transistor N3[1], N3[2], . . . , N3[2N] is the same as another threshold voltage Vth of another NMOS transistor N3[1], N3[2], . . . , N3[2N] or a threshold voltage of PMOS transistor P3 in a corresponding memory cell. In some embodiments, the threshold voltage Vth of one or more of NMOS transistor N3[1], N3[2], . . . , N3[2N] is one or more of a High Threshold Voltage (HVT), Low Threshold Voltage (LVT) or Standard Threshold Voltage (SVT). In some embodiments, SVT is greater than LVT. In some embodiments, HVT is greater than SVT and LVT. In some embodiments, SVT ranges from about 120 millivolts (mV) to about 300 my. In some embodiments, LVT ranges from about 50 mV to about 200 my. In some embodiments, HVT ranges from about 220 mV to about 500 my.

Each pre-charge circuit 304[1], 304[2], . . . , 304[2N] of the set of pre-charge circuits 304 comprises an NMOS transistor N3.

Each NMOS transistor N3 is coupled to and configured to pre-charge a corresponding bit line BL[1], BL[2], . . . , BL[2N] of the set of bit lines BL to voltage Vpc responsive to pre-charge signal PCH. For example, NMOS transistor N3 of pre-charge circuit 304[1] is coupled to bit line BL[1] and is therefore configured to charge bit line BL[1] to the pre-charge voltage Vpc responsive to the pre-charge signal PCH. Similarly, NMOS transistor N3 of pre-charge circuit 304[2] is coupled to bit line BL[2] and is therefore configured to charge bit line BL[2] to the pre-charge voltage Vpc responsive to the pre-charge signal PCH. In this example, when pre-charge signal PCH is applied with a high logical value, transistor N3 is turned on, and pulls the corresponding bit lines BL[1] and BL[2] to a pre-charge voltage Vpc. As a result, bit lines BL[1] and BL[2] are pre-charged to a voltage Vpc.

A gate of each NMOS transistor N3 is configured to receive pre-charge signal PCH. A drain of each NMOS transistor N3 is coupled to the supply voltage Vcc. In some embodiments, the drain of each NMOS transistor N3 is coupled together. A source of each NMOS transistor N3 is coupled with a corresponding bit line BL[1], BL[2], . . . , BL[2N] of the set of bit lines BL. For example, a source of NMOS transistor N3 of pre-charge circuit 304[1] is coupled to bit line BL[1], and a source of NMOS transistor N3 of pre-charge circuit 304[2] is coupled to bit line BL[2].

Other quantities or configurations of the set of pre-charge circuits 304 are within the scope of the present disclosure. NMOS transistor N3 is used to pre-charge the set of bit lines BL is for illustration. Other circuits and/or other types of transistors, such as PMOS transistors, or quantities of transistors, used to pre-charge the set of bit lines BL are within the scope of various embodiments. Other values of voltage Vpc are within the scope of various embodiments.

The set of equalization circuits 306 includes one or more equalization circuits 306[1], 306[2], . . . , 306[N].

Each equalization circuit 306[1], 306[2], . . . , 306[N] of the set of equalization circuits 306 is coupled between a corresponding pair of bit lines of the set of bit lines BL. For example, in some embodiments, equalization circuit 306[1] is coupled between bit line BL[1] and bit line BL[2].

Each equalization circuit 306[1], 306[2], . . . , 306[N] of the set of equalization circuits 306 is coupled between a corresponding pair of pre-charge circuits of the set of bit lines 304. For example, in some embodiments, equalization circuit 306[1] is coupled between pre-charge circuit 304[1] and pre-charge circuit 304[2].

Each equalization circuit 306[1], 306[2], . . . , 306[N] of the set of equalization circuits 306 is configured to receive an equalization signal EQ. In some embodiments, at least one equalization circuit 306[1], 306[2], . . . , 306[N] of the set of equalization circuits 306 is configured to receive a signal different from the equalization signal EQ.

Each equalization circuit 306[1], 306[2], . . . , 306[N] of the set of equalization circuits 306 is coupled to and configured to equalize a voltage of a pair of bit lines of the set of bit lines BL to the pre-charge voltage Vpc responsive to the equalization signal EQ. For example, equalization circuit 306[1] is coupled between bit lines BL[1] and BL[2], and is therefore configured to equalize the voltage of bit lines BL[1] and BL[2] to be equal to the pre-charge voltage Vpc.

Each equalization circuit 306[1], 306[2], . . . , 306[N] of the set of equalization circuits 306 comprises a PMOS transistor P4.

Each PMOS transistor P4 is coupled to and configured to pre-charge a pair of bit lines of the set of bit lines BL to voltage Vpc responsive to equalization signal EQ. For example, PMOS transistor P4 of equalization circuit 306[1] is coupled between bit line BL[1] and BL[2], and is therefore configured to equalize the voltage of bit line BL[1] and BL[2] to the pre-charge voltage Vpc responsive to the equalization signal EQ. In this example, when the equalization signal EQ is applied with a low logical value, PMOS transistor P4 is turned on, enabling bit lines BL[1] and BL[2] to be at the same voltage level (e.g., voltage Vpc) at the sources of NMOS transistor N3. In other words, bit lines BL[1] and BL[2] are pre-charged and equalized to voltage Vpc.

A gate of each PMOS transistor P4 is configured to receive equalization signal EQ. A drain of each PMOS transistor P4 is coupled with a bit line BL[1], BL[2], ..., BL[2N] of the set of bit lines BL, and a source of each PMOS transistor P4 is coupled with another bit line BL[1], BL[2], ..., BL[2N] of the set of bit lines BL. For example, a drain of PMOS transistor P4 of equalization circuit 306[1] is coupled to bit line BL[1], and a source of PMOS transistor P4 of equalization circuit 306[2] is coupled to bit line BL[2]. In some embodiments, the drain and the source of PMOS transistor P4 are used interchangeably.

Other quantities or configurations of the set of equalization circuits 306 are within the scope of the present disclosure. PMOS transistor P4 is used to equalize a pair of bit lines of the set of bit lines BL is for illustration. Other circuits and/or other types of transistors, such as PMOS transistors, or quantities of transistors, are used to equalize a pair of bit lines of the set of bit lines BL are within the scope of various embodiments. Other values of voltage Vpc are within the scope of various embodiments.

The set of write driver circuits 308 includes one or more write driver circuits 308[1], 308[2], ..., 308[N].

Each write driver circuit 308[1], 308[2], ..., 308[N] of the set of write driver circuits 308 is coupled to a corresponding pair of bit lines of the set of bit lines BL at a corresponding pair of nodes ND[1], ND[2], ..., ND[2N] of a set of nodes ND. For example, write driver circuit 308[1] is coupled to bit line BL[1] at a node ND1, and coupled to bit line BL[2] at node ND2.

Each write driver circuit 308[1], 308[2], ..., 308[N] of the set of write driver circuits 308 has a corresponding input terminal configured to receive a corresponding data signal DWB[1], DWB [2], ..., DWB [N] of a set of data signals.

Each write driver circuit 308[1], 308[2], ..., 308[N] of the set of write driver circuits 308 has a corresponding output terminal configured to output the corresponding data signal DataWRen[1], DataWRen[2], ..., DataWRen[N] of the set of data signals to a corresponding pair of bit lines of the set of bit lines BL. For example, write driver circuit 308[1] is configured to receive data signal DWB[1], and to output data signal DataWRen[1] to bit line BL[1] at node ND1, and bit line BL[2] at node ND2.

In some embodiments, one or more write driver circuits 308[1], 308[2], ..., 308[N] of the set of write driver circuits 308 comprises a corresponding inverter I[1], I[2], ..., I[N].

Each inverter I[1], I[2], ..., I[N] has a corresponding input terminal configured to receive a corresponding data signal DWB[1], DWB [2], ..., DWB [N] of a set of data signals. Each inverter I[1], I[2], ..., I[N] has a corresponding output terminal configured to output the corresponding data signal DataWRen[1], DataWRen[2], ..., DataWRen[N] of the set of data signals to a corresponding pair of bit lines of the set of bit lines BL. For example, inverter I[1] is configured to receive data signal DWB[1], and to output data signal DataWRen[1] to bit line BL[1] at node ND1, and bit line BL[2] at node ND2.

Other quantities or configurations of the set of write driver circuits 308 or inverters I[1], I[2], ..., I[N] are within the scope of the present disclosure. An inverter configured to output the data signal to a pair of bit lines of the set of bit lines BL is used for illustration. Other circuits and/or other types of transistors, or quantities of transistors, configured to output the data signal to a pair of bit lines of the set of bit lines BL are within the scope of various embodiments. For example, in some embodiments, a buffer can be utilized to replace a corresponding inverter.

The set of transmission gate circuits 310 includes one or more transmission gate circuits 310[1], 310[2], ..., 310[2N].

Each transmission gate 310[1], 310[2], ..., 310[2N] of the set of transmission gates 310 is coupled to a corresponding bit line BL[1], BL[2], ..., BL[2N] of the set of bit lines BL at a corresponding node of the set of nodes ND. For example, in some embodiments, transmission gate 310[1] is coupled to bit line BL[1] at node ND1, and transmission gate 310[2] is coupled to bit line BL[2] at node ND2.

A pair of adjacent transmission gates 310[1], 310[2], ..., 310[2N] of the set of transmission gates 310 are positioned in a corresponding column 1, 2, ..., N of memory cell array 302, and are configured to receive a corresponding enable signal CS[1], CS[2], ..., CS[N] (collectively referred to as "a first set of enable signals CS") and a corresponding complementary enable signal CSB[1], CSB[2], ..., CSB[N] (collectively referred to as "a second set of enable signals CSB"). For example, in some embodiments, transmission gate 310[1] and transmission gate 310[2] are positioned in column 1 of memory cell array 302, and transmission gate 310[1] is configured to receive enable signal CS[1] and complementary enable signal CSB[1], and transmission gate 310[2] is also configured to receive enable signal CS[1] and complementary enable signal CSB[1].

Within each column 1, 2, ..., N of memory cell array 302, a pair of adjacent transmission gates 310[1], 310[2], ..., 310[2N] of the set of transmission gates 310 are further coupled to a corresponding sense amplifier 312[1], 312[2], ..., 312[N] of the set of sense amplifiers 312. For example, in some embodiments, transmission gates 310[1] and 310[2] are positioned in column 1 of memory cell array 302, and are coupled to sense amplifier 312[1].

Each pair of transmission gates 310[1], 310[2], ..., 310[2N] of the set of transmission gates 310 is configured to provide a connection or isolation between a corresponding pair of bit lines of the set of bit lines BL and a corresponding sense amplifier of the set of sense amplifiers 312 responsive to a corresponding enable signal of the first set of enable signals CS and a corresponding complementary enable signal of the second set of enable signals CSB. For example, transmission gate 310[1] and 310[2] are configured to provide a connection or isolation between bit lines BL[1] and BL[2] and sense amplifier 312[1].

Each node of the set of nodes ND is positioned between a corresponding bit line of the set of bit lines BL and a corresponding transmission gate of the set of transmission gates 310. For example, nodes ND1 and ND2 are positioned between corresponding bit lines BL[1] and BL[2] and corresponding transmission gates 310[1] and 310[2].

Each transmission gate 310[1], 310[2], ..., 310[2N] of the set of transmission gates 310 comprises an NMOS transistor N4 coupled to a PMOS transistor P5.

Within each column 1, 2, ..., N of memory cell array 302, a gate of each NMOS transistor N4 is configured to receive a corresponding enable signal CS[1], CS[2], ..., CS[N] of the first set of enable signals CS. For example, a gate of NMOS transistor N4 of transmission gate 310[1] and a gate of NMOS transistor N4 of transmission gate 310[2] are both configured to receive enable signal CS[1]. Similarly, a gate of NMOS transistor N4 of transmission gate 310[2N–1] and a gate of NMOS transistor N4 of transmission gate 310[2N] are both configured to receive enable signal CS[N].

Within each column 1, 2, . . . , N of memory cell array 302, a gate of each PMOS transistor P5 is configured to receive a corresponding complementary enable signal CSB[1], CSB[1], . . . , CSB[N] of the second set of enable signals CSB. For example, a gate of PMOS transistor P5 of transmission gate circuit 310[1] and a gate of PMOS transistor P5 of transmission gate 310[2] are both configured to receive complementary enable signal CSB[1]. Similarly, a gate of PMOS transistor P5 of transmission gate 310[2N−1] and a gate of PMOS transistor P5 of transmission gate 310[2N] are both configured to receive complementary enable signal CSB[N]. In some embodiments, within each column 1, 2, . . . , N of memory cell array 302, a gate of NMOS transistor N4 is coupled with a corresponding gate of PMOS transistor P5.

A drain of each NMOS transistor N4 of a corresponding transmission gate 310[1], 310[2], . . . , 310[2N] of the set of transmission gates 310 and a source of each PMOS transistor P5 of a corresponding transmission gate 310[1], 310[2], . . . , 310[2N] of the set of transmission gates 310 are coupled to a corresponding bit line BL[1], BL[2], . . . , BL[2N] of the set of bit lines BL at a corresponding node of the set of nodes ND. A drain of each NMOS transistor N4 of a corresponding transmission gate 310[1], 310[2], . . . , 310[2N] of the set of transmission gates 310 is coupled to a source of each PMOS transistor P5 of a corresponding transmission gate 310[1], 310[2], . . . , 310[2N] of the set of transmission gates 310.

For example, in some embodiments, a drain of NMOS transistor N4 of transmission gate 310[1] and a source of PMOS transistor P5 of transmission gate 310[1] are coupled to bit line BL[1] at node ND1. Similarly, a drain of NMOS transistor N4 of transmission gate 310[2] and a source of PMOS transistor P5 of transmission gate 310[2] are coupled to bit line BL[2] at node ND2.

For example, in some embodiments, a drain of NMOS transistor N4 of transmission gate 310[1] is coupled to a source of PMOS transistor P5 of transmission gate 310[1]. Similarly, a drain of NMOS transistor N4 of transmission gate 310[2] is coupled to a source of PMOS transistor P5 of transmission gate 310[2].

A source of each NMOS transistor N4 of a corresponding transmission gate 310[1], 310[2], . . . , 310[2N] of the set of transmission gates 310 is coupled to a drain of each PMOS transistor P5 of a corresponding transmission gate 310[1], 310[2], . . . , 310[2N] of the set of transmission gates 310. For example, in some embodiments, a source of NMOS transistor N4 of transmission gate 310[1] is coupled to a drain of PMOS transistor P5 of transmission gate 310[1]. Similarly, a source of NMOS transistor N4 of transmission gate 310[2] is coupled to a drain of PMOS transistor P5 of transmission gate 310[2].

A pair of source terminals of NMOS transistors N4 of a corresponding pair of transmission gates 310[1], 310[2], . . . , 310[2N] of the set of transmission gates 310 are coupled to a corresponding sense amplifier 312[1], 312[2], . . . , 312[N] of the set of sense amplifiers 312. A pair of drain terminals of PMOS transistors P5 of a corresponding pair of transmission gates 310[1], 310[2], . . . , 310[2N] of the set of transmission gates 310 are coupled to a corresponding sense amplifier 312[1], 312[2], . . . , 312[N] of the set of sense amplifiers 312. For example, in some embodiments, a source of NMOS transistor N4 of transmission gate 310[1] and a drain of PMOS transistor P5 of transmission gate 310[1] are each coupled to sense amplifier 312[1]. Similarly, a source of NMOS transistor N4 of transmission gate 310[2] and a drain of PMOS transistor P5 of transmission gate 310[2] are coupled to sense amplifier 312[1]. In some embodiments, the set of transmission gates 310 are referred to as a set of column select multiplexers.

Other quantities or configurations of the set of transmission gates 310 are within the scope of the present disclosure. NMOS transistor N4 or PMOS transistor P5 in the set of transmission gates 310 is used for illustration. Other circuits and/or other types of transistors, such as NMOS or PMOS transistors, or quantities of transistors, as the set of transmission gates 310 are within the scope of various embodiments.

The set of sense amplifier circuits 312 includes one or more sense amplifier circuits 312[1], 312[2], . . . , 312[N].

At least one sense amplifier 312[1], 312[2], . . . , 312[N] of the set of sense amplifiers 312 is configured to sense or read data stored in a memory cell of memory cell array 302 through a bit line split between a corresponding pair of bit lines in the set of bit lines BL. For example, in some embodiments, sense amplifier 312[1] is configured to sense or read data stored in memory cell 302[1,1] through a bit line split between bit lines BL[1] and BL[2]. In this example, bit line BL[2] is used as a reference bit line to sense or read data stored in memory cell 302[1,1] through bit line BL[1]. Details regarding an exemplary sense amplifier circuit are found, e.g., in U.S. Provisional Application No. 62/691,745, filed Jun. 29, 2018, or U.S. Pat. No. 9,679,619, granted Jun. 13, 2017, U.S. Pre-Grant Publication No. 20140269128, published Sep. 18, 2014, the entireties of each of which are hereby incorporated by reference.

Each sense amplifier 312[1], 312[2], . . . , 312[N] of the set of sense amplifiers 312 has a corresponding first input terminal configured to receive a corresponding sense amplifier enable signal SAen[1], SAen[2], . . . , SAen[N] of a set of sense amplifier enable signals SAen.

Each sense amplifier 312[1], 312[2], . . . , 312[N] of the set of sense amplifiers 312 further includes a corresponding pair of input terminals coupled to a corresponding pair of bit lines of the set of bit lines BL at a corresponding pair of nodes ND[1], ND[2], . . . , ND[2N] of a set of nodes ND. Each corresponding pair of input terminals of sense amplifier 312[1], 312[2], . . . , 312[N] of the set of sense amplifiers 312 is configured to receive a pair of corresponding voltages of the corresponding pair of bit lines of the set of bit lines BL. For example, sense amplifier 312[1] is coupled through transmission gate 310[1] to bit line BL[1] at node ND1 and sense amplifier 312[1] is configured to receive the corresponding voltage of bit line BL[1]. Similarly, sense amplifier 312[1] is coupled through transmission gate 310[2] to bit line BL[2] at node ND2, and sense amplifier 312[1] is configured to receive the corresponding voltage of bit line BL[2].

In some embodiments, each sense amplifier of the set of sense amplifiers 312 is configured to sense a difference between a voltage of a bit line of the set of bit lines BL and a voltage of another bit line of the set of bit lines BL, responsive to a sense amplifier enable signal of the set of sense amplifier enable signals SAen. In some embodiments, a voltage of another bit line is used as a reference bit line to develop a bit line split between the voltage of the bit line and another bit line. In some embodiments, the another bit line is adjacent to or directly next to the bit line.

Each sense amplifier 312[1], 312[2], . . . , 312[N] of the set of sense amplifiers 312 has a corresponding output terminal configured to output a corresponding data signal DataOut[1], DataOut[1], . . . , DataOut[N] of the set of data signals, responsive to a sense amplifier enable signal of the set of sense amplifier enable signals SAen. For example, sense amplifier 312[1] is configured to output data signal DataOut[1] responsive to sense amplifier enable signal SAen[1], and sense amplifier 312[N] is configured to output data signal DataOut[N] responsive to sense amplifier enable signal SAen[N].

Other circuits, quantities or configurations of the set of sense amplifiers 312 are within the scope of the present disclosure.

In some embodiments, even though bit line BL[2] is not coupled to memory cell 302[1,1], bit line BL[2] is used as a reference bit line for sense amplifier 312[1] when reading data stored in memory cell 302[1,1] through bit line BL[1]. In some embodiments, by using bit line BL[2] as the reference bit line, sense amplifier 312[1] is implemented with a differential sensing configuration resulting in a faster sensing time and a lower signal to noise ratio than other approaches.

In some embodiments, by pre-charging bit lines BL[1] and BL[2] to the pre-charge voltage Vpc by NMOS transistors N3 results in a natural pre-charge voltage level compared with other approaches that have pre-charge voltage levels generated from additional circuitry.

In some embodiments, by using a PMOS transistor P3 in memory cell 302[1,1] allows PMOS transistor P2 in memory cell 302[1,1] to pull bit line BL[1] to the supply voltage Vcc (e.g., logical high) resulting in a larger predetermined value ΔV allowing for a larger bit line split to develop between bit line BL[1] and BL[2] and causing sense amplifier 312[1] to better sense the written data than other approaches.

In some embodiments, memory circuit 300 also includes other circuits (e.g., other driver circuits, timing circuits, decoder circuits, etc.) that are not described for simplicity.

Figure 4:
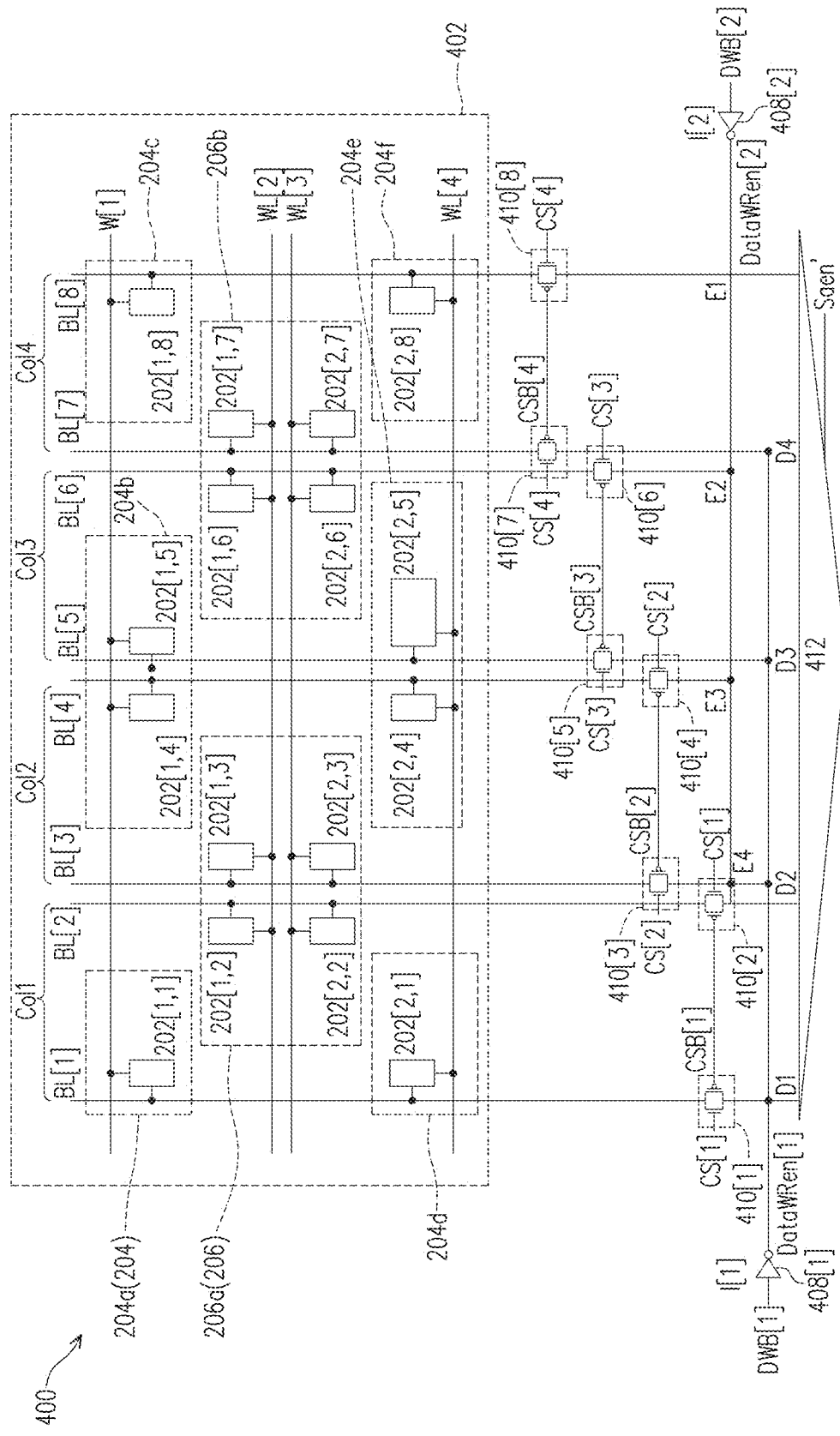
FIG. 4 is a circuit diagram of a memory circuit, in accordance with some embodiments.

FIG. 4 is a circuit diagram of a memory circuit 400, in accordance with some embodiments. FIG. 4 illustrates how multiple columns can be selected (e.g., Column Multiplexing) to share a sense amplifier to reduce area. In some embodiments, memory circuit 400 is a 4:1 column multiplexing circuit implementation with a single sense amplifier (e.g., sense amplifier 412).

Memory circuit 400 includes a memory cell array 402, a set of write driver circuits 408, a set of transmission gate circuits 410 and a sense amplifier 412.

Memory cell array 402 is a variation of memory cell array 200 of FIG. 2, and similar detailed description is therefore omitted. For example, memory cell array 402 corresponds to memory cell array 200 when M=2 rows and N=4 columns. In other words, memory cell array 402 includes rows 1 and 2, and columns 1, 2, 3 and 4 of memory cell array 200 of FIG. 2. Memory cell array 402 includes bit lines BL[1], BL[2], . . . , BL[8] of the set of bit lines BL and word lines WL[1], WL[2], . . . , WL[4] of the set of word lines WL coupled to array of memory cells 202[1,1], 202[1,2], . . . , 202[2,2], . . . , 202[2,8].

Bit lines BL[1], BL[3], BL[5] and BL[7] are referred to as a set of odd bit lines BLodd. Bit lines BL[2], BL[4], BL[6] and BL[8] are referred to as a set of even bit lines B Leven.

Set of write driver circuits 408 is similar to the set of write driver circuits 308 of FIG. 3, and similar detailed description is therefore omitted. Inverter I[1] in write driver circuit 408[1] and inverter I[2] in write driver circuit 408[2] are similar to one or more of inverters I[1], I[2], . . . , I[N] of FIG. 3, and similar detailed description is therefore omitted. Set of transmission gate circuits 410 is similar to set of transmission gate circuits 310 of FIG. 3, and similar detailed description is therefore omitted. Sense amplifier 412 is similar to at least one sense amplifier of the set of sense amplifiers 312 of FIG. 3, and similar detailed description is therefore omitted.

The set of write driver circuits 408 includes one or more of write driver circuits 408[1] and 408[2]. Write driver circuits 408[1] and 408[2] include corresponding inverters I[1] and I[2]. Write driver circuits 408[1] and 408[2] are similar to corresponding write driver circuits 308[1] and 308[N] of FIG. 3, and similar detailed description is therefore omitted. Inverters I[1] and I[2] are similar to corresponding inverters I[1] and I[N] of FIG. 3, and similar detailed description is therefore omitted.

Write driver circuit 408[1] is coupled to nodes D1, D2, D3 and D4 of a set of nodes D. Write driver circuit 408[1] is coupled to a corresponding bit line BL[1], BL[3], BL[5], BL[7] of the set of odd bit lines BLodd by a corresponding transmission gate 410[1], 410[3], 410[5], 410[7] of the set of transmission gates 410.

Write driver circuit 408[2] is coupled to nodes E1, E2, E3 and E4 of a set of nodes E. Write driver circuit 408[2] is coupled to a corresponding bit line BL[2], BL[4], BL[6], BL[8] of the set of even bit lines BLeven by a corresponding transmission gate 410[2], 410[4], 410[6], 410[8] of the set of transmission gates 410.

Write driver circuit 408[1] or 408[2] is positioned below the set of transmission gates 410. Write driver circuit 408[1] or 408[2] is between the set of transmission gates 410 and sense amplifier 412.

The set of transmission gates 410 includes one or more of transmission gates 410[1], 410[2], . . . , 410[8]. Transmission gates 410[1], 410[2], . . . , 410[8] are similar to corresponding transmission gates 310[1], 310[2], . . . , 310[8] of FIG. 3, and similar detailed description is therefore omitted.

Transmission gate 410[1], 410[3], 410[5], 410[7] of the set of transmission gates 410 is coupled between a corresponding node D1, D2, D3, D4 of the set of nodes D and a corresponding bit line BL[1], BL[3], BL[5], BL[7] of the set of odd bit lines BLodd.

Transmission gate 410[2], 410[4], 410[6], 410[8] of the set of transmission gates 410 is coupled between a corresponding node E4, E3, E2, E1 of the set of nodes E and a corresponding bit line BL[2], BL[4], BL[6], BL[8] of the set of even bit lines BLeven.

Sense amplifier 412 includes a first input terminal, a second input terminal, a third input terminal and an output terminal.

The first input terminal of sense amplifier 412 is similar to the first input terminal of one or more sense amplifiers of the set of sense amplifiers 312, and similar detailed description is therefore omitted.

The first input terminal of sense amplifier 412 is configured to receive a sense amplifier enable signal SAen'. Sense amplifier enable signal SAen' is similar to one or more sense amplifier enable signals of the set of sense amplifier enable signals SAen, and similar detailed description is therefore omitted.

The second input terminal of sense amplifier 412 is coupled to nodes D2, D3 and D4 of the set of nodes D by node D1. The second input terminal of sense amplifier 412 is coupled to a corresponding bit line BL[1], BL[3], BL[5], BL[7] of the set of odd bit lines BLodd by a corresponding transmission gate 410[1], 410[3], 410[5], 410[7] of the set of transmission gates 410.

The third input terminal of sense amplifier 412 is coupled to nodes E4, E3 and E2 of the set of nodes E by node E1. The third input terminal of sense amplifier 412 is coupled to a corresponding bit line BL[2], BL[4], BL[6], BL[8] of the set of even bit lines BLeven by a corresponding transmission gate 410[2], 410[4], 410[6], 410[8] of the transmission gates 410.

The output terminal of sense amplifier 412 is similar to the output terminal of one or more sense amplifiers of the set of sense amplifiers 312, and similar detailed description is therefore omitted. The output terminal of sense amplifier 412 is configured to output a data signal DataOut'. Data signal DataOut' is similar to one or more data signals of the set of data signals DataOut', and similar detailed description is therefore omitted.

In some embodiments, memory circuit 400 is referred to as a 4:1 column multiplexing circuit implementation with a single sense amplifier (e.g., sense amplifier 412). In some embodiments, the columns 1, 2, 3 and 4 of memory cell array 402 are multiplexed with each other such that during a write or a read cycle of a memory cell in memory cell array 402, a single column containing a corresponding even bit line and a corresponding odd bit line is selected. For example, in some embodiments, a bit line BL[1], BL[3], BL[5], BL[7] of the set of odd bit lines BLodd and a corresponding bit line BL[2], BL[4], BL[6], BL[8] of the set of even bit lines BLeven are selected by a corresponding enable signal CS[1], CS[2], CS[3], CS[4] of the first set of enable signals CS being a logical high and a complementary enable signal CSB[1], CSB[2], CSB[3], CSB[4] of the second set of enable signals CSB being a logical low. In some embodiments, by selecting an individual column, a memory cell within the selected column coupled to either the odd bit line or the even bit line is written to by write driver circuit 408[1] or 408[2] or read by sense amplifier 412.

Other numbers of columns multiplexed together or configurations of memory circuit 400 are within the scope of the present disclosure. For example, other numbers of rows and/or columns in memory cell array 402, and column multiplexing combinations are within the scope of the present disclosure.

In some embodiments, memory circuit 400 of FIG. 4 does not show the set of pre-charge circuits 304 and the set of equalization circuits 306 of memory circuit 300 of FIG. 3 for ease of illustration, but the set of pre-charge circuits 304 and the set of equalization circuits 306 of memory circuit 300 can also be included in memory circuit 400, and similar detailed description is therefore omitted. FIG. 4 illustrates how multiple columns can be selected (Column Multiplexing) to share a sense amplifier to reduce area.

Other circuits, quantities or configurations of memory circuit 400 are within the scope of the present disclosure. For example, other numbers of rows and/or columns in memory cell array 402, and column multiplexing combinations are within the scope of the present disclosure.

Waveforms—Read Operation of A 1

Figure 5:
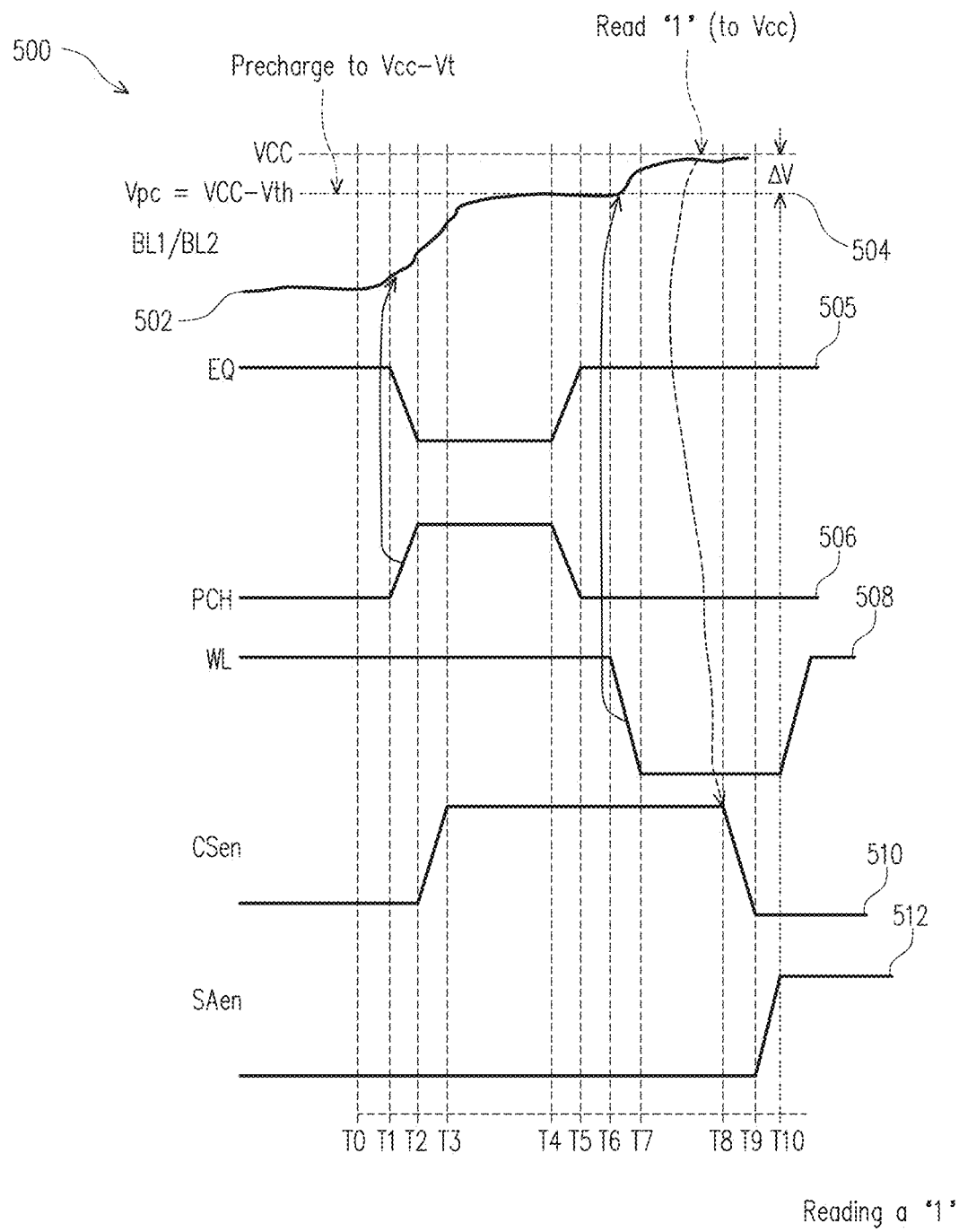
FIG. 5 is a graph of waveforms, in accordance with some embodiments.

FIG. 5 is a graph of waveforms 500, in accordance with some embodiments.

Waveform 500 corresponds to waveforms of signals in a read operation of a high logical value stored in memory cell 302[1,1] of memory cell array 302 of FIG. 3.

In this illustration, memory cell 302[1,1] initially stores a high logical value, and a read operation of the high logical value of memory cell 302[1,1] is performed by sense amplifier 312[1]. In this illustration, a logical high is equal to supply voltage Vcc, and a logical low is equal to supply voltage Vss.

In some embodiments, curve 502 represents bit line signal BL1 of bit line BL[1] of FIG. 3 or 4; curve 504 represents bit line signal BL2 of bit line BL[2] of FIG. 3 or 4; curve 505 represents equalization signal EQ received by equalization circuit 306[1]; curve 506 represents pre-charge signal PCH received by pre-charge circuit 304[1] or 304[2]; curve 508 represents word line signal WL of word line WL[1] of FIG. 3 or 4; curve 510 represents signal CS received by at least transmission gate 310[1], 310[2], 410[1] or 410[2]; and curve 512 represents sense amplifier enable signal SAen received by sense amplifier 312[1] or 412.

At time T0, curve 505 is a high logical value causing equalization circuit 306[1] to remain off, and curve 506 is a low logical value causing pre-charge circuits 304[1] and 304[2] to remain off.

At time T0, curve 508 is a high logical value causing PMOS transistor P3 in memory cell 302[1,1] to remain off, and the bit lines BL[1] and BL[2] are not connected to the memory cell 302[1,1].

At time T0, curve 510 is a low logical value causing transmission gates 310[1] and 310[2] to remain off, and the bit lines BL[1] and BL[2] are not connected to the sense amplifier 312[1,1].

At time T0, curve 512 is a low logical value causing sense amplifier 312[1] to remain off.

At time T1, curve 505 transitions to a low logical value causing PMOS transistor P4 in equalization circuit 306[1] to begin to turn on, and curve 506 transitions from a low logical value to a high logical value causing NMOS transistors N3 in each of pre-charge circuits 304[1] and 304[2] to begin to turn on. As NMOS transistors N3 begin to turn on causes bit lines BL[1] and BL[2] (as shown by curves 502 and 504, respectively) to begin to transition to the pre-charge voltage Vpc by the corresponding pre-charge circuits 304[1] and 304[2]. In other words, curves 502 and 504 begin to transition to the pre-charge voltage Vpc by NMOS transistors N3 turning on.

At time T2, curve 505 is a low logical value causing PMOS transistor P4 in equalization circuit 306[1] to turn on equalization circuit 306[1] thereby coupling bit lines BL[1] and BL[2] and equalizing the corresponding voltages of the bit lines BL[1] and BL[2], and curve 506 is a high logical value causing NMOS transistors N3 in each of pre-charge circuits 304[1] and 304[2] to turn on thereby pre-charging bit lines BL[1] and BL[2] (as shown by curves 502 and 504, respectively) to the pre-charge voltage Vpc.

At time T2, curve 510 transitions from a low logical value to a high logical value causing transmission gates 310[1] and 310[2] to turn on. As a result of transmission gates 310[1] and 310[2] turning on causes corresponding bit lines BL[1] and BL[2] to be connected to sense amplifier 312[1,1].

At time T3, curve 510 is a high logical value causing transmission gates 310[1] and 310[2] to be turned on thereby connecting corresponding bit lines BL[1] and BL[2] to sense amplifier 312[1,1].

At time T4, curves 502 and 504 are at the pre-charge voltage Vpc, curve 505 transitions to a high logical value causing PMOS transistor P4 in equalization circuit 306[1] to begin to turn off, and curve 506 transitions from a high logical value to a low logical value causing NMOS transistors N3 in each of pre-charge circuits 304[1] and 304[2] to begin to turn off. After time T4, curve 502 remains at the pre-charge voltage Vpc, and is used as a reference voltage for bit line BL[1] and sense amplifier 312[1].

At time T5, curve 505 is a high logical value causing PMOS transistor P4 in equalization circuit 306[1] to turn off, and curve 506 is a low logical value causing NMOS transistors N3 in each of pre-charge circuits 304[1] and 304[2] to turn off.

At time T6, curve 508 transitions from a high logical value to a low logical value causing PMOS transistor P3 in memory cell 302[1,1] to begin to turn on. Prior to time T6, a logical high is stored at node ND1 in memory cell 302[1,1]. As PMOS transistor P3 begins to turn on causes node ND1 of memory cell 302[1,1] to be connected to bit line BL[1] thereby causing the voltage of bit line BL[1] to be pulled towards the stored high logical value of node ND1. Curve 502 at time T6, illustrates the transition of the voltage of the bit line BL[1] from the pre-charge voltage Vpc to the high logical value.

At time T7, curve 508 is a low logical value causing PMOS transistor P3 in memory cell 302[1,1] to turn on thereby connecting node ND1 of memory cell 302[1,1] to bit line BL[1]. As node ND1 of memory cell 302[1,1] is connected to bit line BL[1] causes the voltage of bit line BL[1] to continue to be pulled towards the stored high logical value as shown by curve 502 at time T7.

At time T8, curve 510 transitions from a high logical value to a low logical value causing transmission gates 310[1] and 310[2] to begin to turn off. As a result of transmission gates 310[1] and 310[2] turning off causes corresponding bit lines BL[1] and BL[2] to begin to be disconnected from sense amplifier 312[1,1]. In some embodiments, the transition of curve 510 from a high logical value to a low logical value occurs when a data split between bit line BL[1] and BL[2] is equal to or greater than a predetermined value ΔV which is sufficient for the sense amplifier 312[1] to detect the data split. At time T8, the data split between bit line BL[1] and BL[2] is equal to the predetermined value ΔV as shown by corresponding curves 502 and 504. In some embodiments, the predetermined value ΔV is equal to the threshold voltage Vth of NMOS transistor N3.

At time T9, curve 510 is a low logical value causing transmission gates 310[1] and 310[2] to turn off thereby disconnecting corresponding bit lines BL[1] and BL[2] from sense amplifier 312[1,1].

At time T9, curve 512 transitions from a low logical value to a high logical value causing sense amplifier 312[1] to begin to turn on. In some embodiments, sense amplifier 312[1] is set to be enabled or turned on by sense amplifier enable signal SAen[1] after the data split between bit line BL[1] and BL[2] is equal to or greater than the predetermined value ΔV.

At time T10, curve 508 transitions from a low logical value to a high logical value causing PMOS transistor P3 in memory cell 302[1,1] to begin to turn off. As PMOS transistor P3 begins to turn off causes node ND1 of memory cell 302[1,1] to be disconnected from bit line BL[1].

At time T10, curve 512 is a high logical value causing sense amplifier 312[1] to turn on. In some embodiments, the data split between bit line BL[1] and BL[2] is equal to or greater than the predetermined value ΔV causing sense amplifier 312[1] to correctly sense or read the data stored in memory cell 302[1,1]. In some embodiments, bit line BL[2] is used as a reference bit line for sense amplifier 312[1] when reading data stored in memory cell 302[1,1] through bit line BL[1]. In some embodiments, if data stored in memory cell 302[1,2] were read through bit line BL[2], then bit line BL[1] is used as a reference bit line for sense amplifier 312[1]. In other words, the reference bit line is changed with the bit line connected to the selected memory cell to be read from.

In some embodiments, even though bit line BL[2] is not coupled to memory cell 302[1,1], bit line BL[2] is used as a reference bit line for sense amplifier 312[1] when reading data stored in memory cell 302[1,1] through bit line BL[1]. In some embodiments, by using bit line BL[2] as the reference bit line, sense amplifier 312[1] is implemented with a differential sensing configuration resulting in a faster sensing time and a lower signal to noise ratio than other approaches.

In some embodiments, by pre-charging bit lines BL[1] and BL[2] to the pre-charge voltage Vpc by NMOS transistors N3 results in a natural pre-charge voltage level compared with other approaches that have pre-charge voltage levels generated from additional circuitry.

In some embodiments, by using a PMOS transistor P3 in memory cell 302[1,1] allows PMOS transistor P2 in memory cell 302[1,1] to pull bit line BL[1] to the supply voltage Vcc (e.g., logical high) resulting in a larger predetermined value ΔV allowing for a larger bit line split to develop between bit line BL[1] and BL[2] and causing sense amplifier 312[1] to better sense the written data than other approaches.

While FIG. 5 is explained with reference to memory cell 302[1,1], bit lines BL[1] and BL[2], pre-charge circuits 304[1] and 304[2], word line WL[1], transmission gates 310[1] and 310[2] and sense amplifier 312[1], and the corresponding signals, the teachings of FIG. 5 are also applicable to the other circuits and corresponding signals in memory circuit 300 of FIG. 3 or memory circuit 400 of FIG. 4. Furthermore, one or more of the advantages of memory circuit 300 described with respect to FIG. 3, are also applicable to the memory circuit 400 of FIG. 4.

Waveforms—Read Operation of A 0

Figure 6:
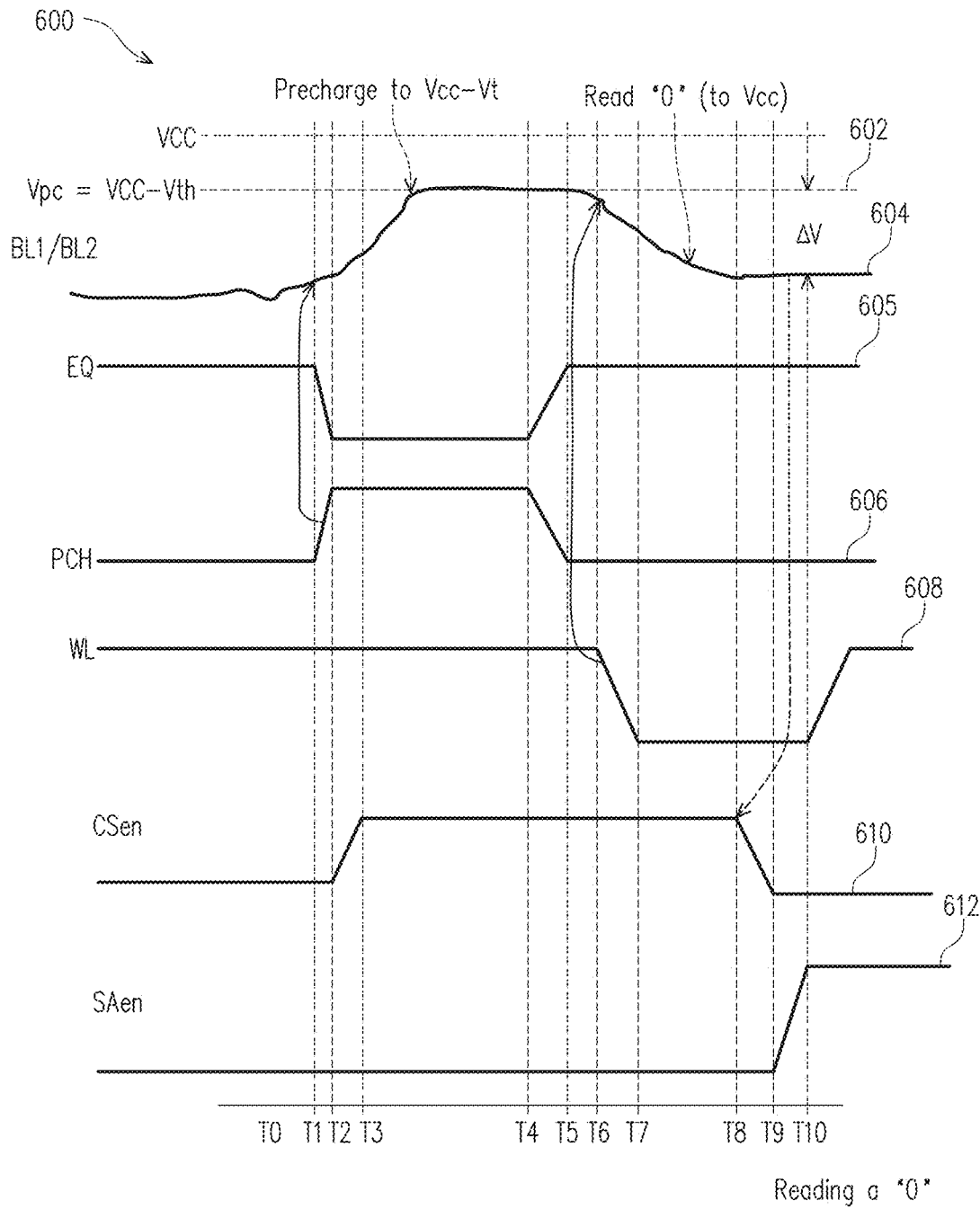
FIG. 6 is a graph of waveforms, in accordance with some embodiments.

FIG. 6 is a graph of waveforms 600, in accordance with some embodiments.

Waveform 600 corresponds to waveforms of signals in a read operation of a low logical value stored in memory cell 302[1,1] of memory cell array 302 of FIG. 3.

Waveforms 600 is a variation of waveform 500 of FIG. 5. Waveforms 600 are similar to waveforms 500 of FIG. 5, and similar detailed description is therefore omitted.

Waveforms 600 include waveforms of signals in a read operation of memory cell 302[1,1] of memory cell array 302 of FIG. 3. In this illustration, memory cell 302[1,1] initially stores a low logical value, and a read operation of the low logical value of memory cell 302[1,1] is performed by sense amplifier 312[1]. In this illustration, a logical high is equal to supply voltage Vcc, and a logical low is equal to supply voltage Vss.

In some embodiments, curve 602 represents bit line signal BL1 of bit line BL[1] of FIG. 3 or 4; curve 604 represents bit line signal BL2 of bit line BL[2] of FIG. 3 or 4; curve 605 represents equalization signal EQ received by equalization circuit 306[1]; curve 606 represents pre-charge signal PCH received by pre-charge circuit 304[1] or 304[2]; curve 608 represents word line signal WL of word line WL[1] of FIG. 3 or 4; curve 610 represents signal CS received by at least transmission gate 310[1], 310[2], 410[1] or 410[2]; and curve 612 represents sense amplifier enable signal SAen received by sense amplifier 312[1] or 412.

From time T0 through time T5, curves 602, 604, 605, 606, 608, 610 and 612 are similar to corresponding curves 502, 504, 505, 506, 508, 510 and 512 of FIG. 5, and similar detailed description is therefore omitted.

After time T4, curve 602 remains at the pre-charge voltage Vpc, and is used as a reference voltage for bit line BL[1] and sense amplifier 312[1].

At time T6, curve 608 transitions from a high logical value to a low logical value causing PMOS transistor P3 in memory cell 302[1,1] to begin to turn on. Prior to time T6, a logical low is stored at node ND1 in memory cell 302[1,1]. As PMOS transistor P3 begins to turn on causes node ND1 of memory cell 302[1,1] to be connected to bit line BL[1] thereby causing the voltage of bit line BL[1] to be pulled towards the stored low logical value of node ND1. Curve 602 at time T6, illustrates the transition of the voltage of the bit line BL[1] from the pre-charge voltage Vpc to the low logical value.

At time T7, curve 608 is a low logical value causing PMOS transistor P3 in memory cell 302[1,1] to turn on thereby connecting node ND1 of memory cell 302[1,1] to bit line BL[1]. As node ND1 of memory cell 302[1,1] is connected to bit line BL[1] causes the voltage of bit line BL[1] to continue to be pulled towards the stored low logical value as shown by curve 602 at time T7.

At time T8, curve 610 transitions from a high logical value to a low logical value causing transmission gates 310[1] and 310[2] to begin to turn off. As a result of transmission gates 310[1] and 310[2] turning off causes corresponding bit lines BL[1] and BL[2] to begin to be disconnected from sense amplifier 312[1,1]. In some embodiments, the transition of curve 610 from a high logical value to a low logical value occurs when a data split between bit line BL[1] and BL[2] is equal to or greater than a predetermined value ΔV which is sufficient for the sense amplifier 312[1] to detect the data split. At time T8, the data split between bit line BL[1] and BL[2] is equal to the predetermined value ΔV as shown by corresponding curves 602 and 604. In some embodiments, the predetermined value ΔV is equal to supply voltage Vcc minus two times the threshold voltage Vth (ΔV=Vcc−2Vth) of NMOS transistor N3.

At time T9, curve 610 is a low logical value causing transmission gates 310[1] and 310[2] to turn off thereby disconnecting corresponding bit lines BL[1] and BL[2] from sense amplifier 312[1,1].

At time T9, curve 612 transitions from a low logical value to a high logical value causing sense amplifier 312[1] to begin to turn on. In some embodiments, sense amplifier 312[1] is set to be enabled or turned on by sense amplifier enable signal SAen[0] after the data split between bit line BL[1] and BL[2] is equal to or greater than the predetermined value ΔV.

At time T10, curve 608 transitions from a low logical value to a high logical value causing PMOS transistor P3 in memory cell 302[1,1] to begin to turn off. As PMOS transistor P3 begins to turn off causes node ND1 of memory cell 302[1,1] to be disconnected from bit line BL[1].

At time T10, curve 612 is a high logical value causing sense amplifier 312[1] to turn on. In some embodiments, the data split between bit line BL[1] and BL[2] is equal to or greater than the predetermined value ΔV causing sense amplifier 312[1] to correctly sense or read the data stored in memory cell 302[1,1]. In some embodiments, bit line BL[2] is used as a reference bit line for sense amplifier 312[1] when reading data stored in memory cell 302[1,1] through bit line BL[1].

In some embodiments, even though bit line BL[2] is not coupled to memory cell 302[1,1], bit line BL[2] is used as a reference bit line for sense amplifier 312[1] when reading data stored in memory cell 302[1,1] through bit line BL[1].

In some embodiments, by using bit line BL[2] as the reference bit line, sense amplifier 312[1] is implemented with a differential sensing configuration resulting in a faster sensing time and a lower signal to noise ratio than other approaches.

In some embodiments, by pre-charging bit lines BL[1] and BL[2] to the pre-charge voltage Vpc by NMOS transistors N3 results in a natural pre-charge voltage level compared with other approaches that have pre-charge voltage levels generated from additional circuitry.

In some embodiments, by using a PMOS transistor P3 in memory cell 302[1,1] allows PMOS transistor P2 in memory cell 302[1,1] to pull bit line BL[1] to the supply voltage Vcc (e.g., logical high) resulting in a larger predetermined value ΔV allowing for a larger bit line split to develop between bit line BL[1] and BL[2] and causing sense amplifier 312[1] to better sense the written data than other approaches.

While FIG. 6 is explained with reference to memory cell 302[1,1], bit lines BL[1] and BL[2], pre-charge circuits 304[1] and 304[2], word line WL[1], transmission gates 310[1] and 310[2] and sense amplifier 312[1], and the corresponding signals, the teachings of FIG. 6 are also applicable to the other circuits and corresponding signals in memory circuit 300 of FIG. 3 or memory circuit 400 of FIG. 4.

Waveforms—Write Operation

Figures 7A, 7B:
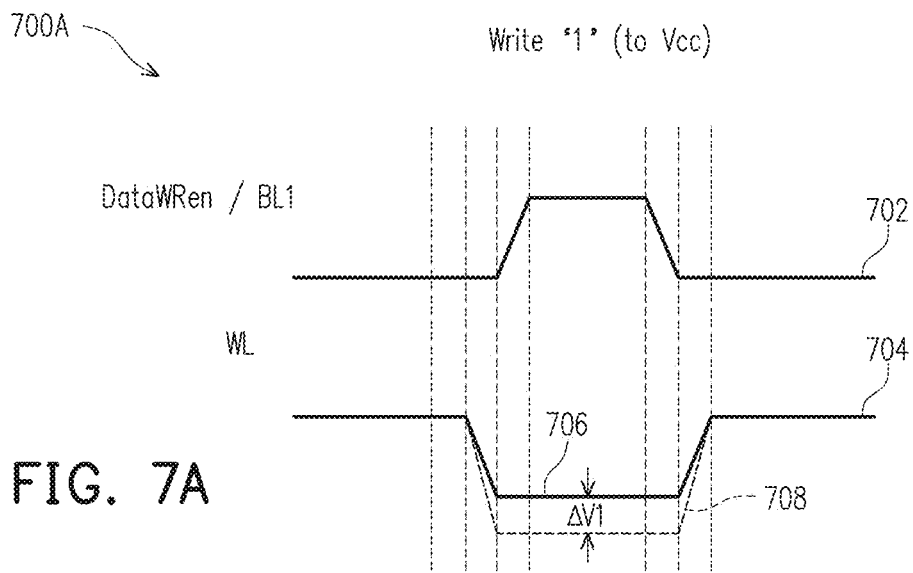
FIGS. 7A-7B are graphs of waveforms, in accordance with some embodiments.

FIGS. 7A-7B are graphs of corresponding waveforms 700A-700B, in accordance with some embodiments.

Waveform 700A corresponds to waveforms of signals in a write operation of a high logical value stored in memory cell 302[1,1] of memory cell array 302 of FIG. 3. Waveform 700B corresponds to waveforms of signals in a write operation of a low logical value stored in memory cell 302[1,1] of memory cell array 302 of FIG. 3.

Waveforms 700A-700B are a variation of waveform 500 of FIG. 5. Waveforms 700A-700B are similar to waveforms 500 of FIG. 5, and similar detailed description is therefore omitted.

In some embodiments, curve 702 represents at least the data signal DataWRen or the bit line signal BL1 of bit line BL[1] of FIG. 3 or 4; curve 704 represents word line signal WL of word line WL[1] of FIG. 3 or 4. Curve 704 includes a curve portion 706 or a curve portion 708 (described below).

At time T0, curve 702 is a low logical value, and curve 704 is a high logical value causing PMOS transistor P3 in memory cell 302[1,1] to remain off.

At time T1, curve 704 transitions to the low logical value causing PMOS transistor P3 in memory cell 302[1,1] to begin to turn on. As PMOS transistor P3 begins to turn on causes bit lines BL[1] to be coupled to storage node ND1 of memory cell 301[1,1]. The low logical value is shown by curve portion 706 or curve portion 708. The difference between curve portion 706 and curve portion 708 is ΔV1.

Curve portion 706 represents a version of the word line signal WL of word line WL[1] of FIG. 3 or 4 driven to VSS. Curve 708 represents an under driven version of the word line signal WL of word line WL[1] of FIG. 3 or 4 driven to below VSS (e.g., negative voltage) by a write assist circuit (not shown) or a charge pump circuit. In some embodiments, by using the under driven version of the word line signal WL[1], shown by curve portion 708, it causes the PMOS transistor P3 to be turned on stronger than not being driven by the under driven word line signal resulting in the low logical value of the bit line signal to be passed to the memory cell 302[1,1]. Details regarding an exemplary write assist circuit or a negative word line voltage generator circuit are found, e.g., in U.S. Pre-Grant Publication No. 20150348598, published Dec. 3, 2015, the entireties of each of which are hereby incorporated by reference. Details regarding an exemplary charge pump circuit are found, e.g., in U.S. Pat. No. 9,787,176, granted Oct. 10, 2017, U.S. Pre-Grant Publication No. 20160268893, published Sep. 15, 2016, the entireties of each of which are hereby incorporated by reference.

At time T2, curve 704 (e.g., curve portions 706 and 708) is the low logical value causing PMOS transistor P3 in memory cell 302[1,1] to be turned on thereby coupling bit line BL[1] to storage node ND1 of memory cell 302[1,1].

At time T2, curve 702 transitions to the high logical value causing the bit line signal BL[1] to transition to the high logical value.

At time T3, curve 702 is the high logical value causing the bit line signal BL[1] to be the high logical value thereby writing the high logical value to memory cell 302[1,1], and memory cell 302[1,1] latches the data signal DataWRen.

At time T4, curve 702 transitions to the low logical value causing the bit line signal BL[1] to transition to the low logical value.

At time T5, curve 702 is the low logical value and bit line signal BL[1] is the low logical value, and curve 704 (e.g., curve portions 706 and 708) transitions to the high logical value causing PMOS transistor P3 in memory cell 302[1,1] to be turned off thereby decoupling bit line BL[1] from storage node ND1 of memory cell 302[1,1].

At time T6, curve 704 (e.g., curve portions 706 and 708) is the high logical value causing PMOS transistor P3 in memory cell 302[1,1] to be off.

Waveform 700B corresponds to waveforms of signals in a write operation of a low logical value stored in memory cell 302[1,1] of memory cell array 302 of FIG. 3.

In some embodiments, curve 710 represents at least the data signal DataWRen or the bit line signal BL1 of bit line BL[1] of FIG. 3 or 4; curve 712 represents word line signal WL of word line WL[1] of FIG. 3 or 4. Curve 712 includes a curve portion 714 or a curve portion 716 (described below).

At time T0, curve 710 is a high logical value, and curve 712 is a high logical value causing PMOS transistor P3 in memory cell 302[1,1] to remain off.

At time T1, curve 712 transitions to the low logical value causing PMOS transistor P3 in PMOS transistor P3 in memory cell 302[1,1] to begin to turn on. As PMOS transistor P3 begins to turn on causes bit lines BL[1] to be coupled to storage node ND1 of memory cell 301[1,1]. The low logical value is shown by curve portion 714 or curve portion 716. The difference between curve portion 714 and curve portion 716 is ΔV1.

Curve portion 714 represents a version of the word line signal WL of word line WL[1] of FIG. 3 or 4 driven to VSS. Curve 716 represents an under driven version of the word line signal WL of word line WL[1] of FIG. 3 or 4 driven to below VSS (e.g., negative voltage) by a write assist circuit (not shown). In some embodiments, by using the under driven version of the word line signal WL[1], shown by curve portion 716, causes the PMOS transistor P3 to be turned on stronger than not being driven by the under driven word line signal resulting in the low logical value of the bit line signal to be passed to the memory cell 302[1,1].

At time T2, curve 712 (e.g., curve portions 714 and 716) is the low logical value causing PMOS transistor P3 in memory cell 302[1,1] to be turned on thereby coupling bit line BL[1] to storage node ND1 of memory cell 302[1,1].

At time T2, curve 710 transitions to the low logical value causing the bit line signal BL[1] to transition to the low logical value.

At time T3, curve 710 is the low logical value causing the bit line signal BL[1] to be the low logical value thereby writing the low logical value to memory cell 302[1,1], and memory cell 302[1,1] latches the data signal DataWRen.

At time T4, curve 710 transitions to the high logical value causing the bit line signal BL[1] to transition to the high logical value.

At time T5, curve 710 is the high logical value and bit line signal BL[1] is the high logical value, and curve 712 (e.g., curve portions 714 and 716) transitions to the high logical value causing PMOS transistor P3 in memory cell 302[1,1] to be turned off thereby decoupling bit line BL[1] from storage node ND1 of memory cell 302[1,1].

At time T6, curve 712 (e.g., curve portions 714 and 716) is the high logical value causing PMOS transistor P3 in memory cell 302[1,1] to be off.

Method

Figure 8:
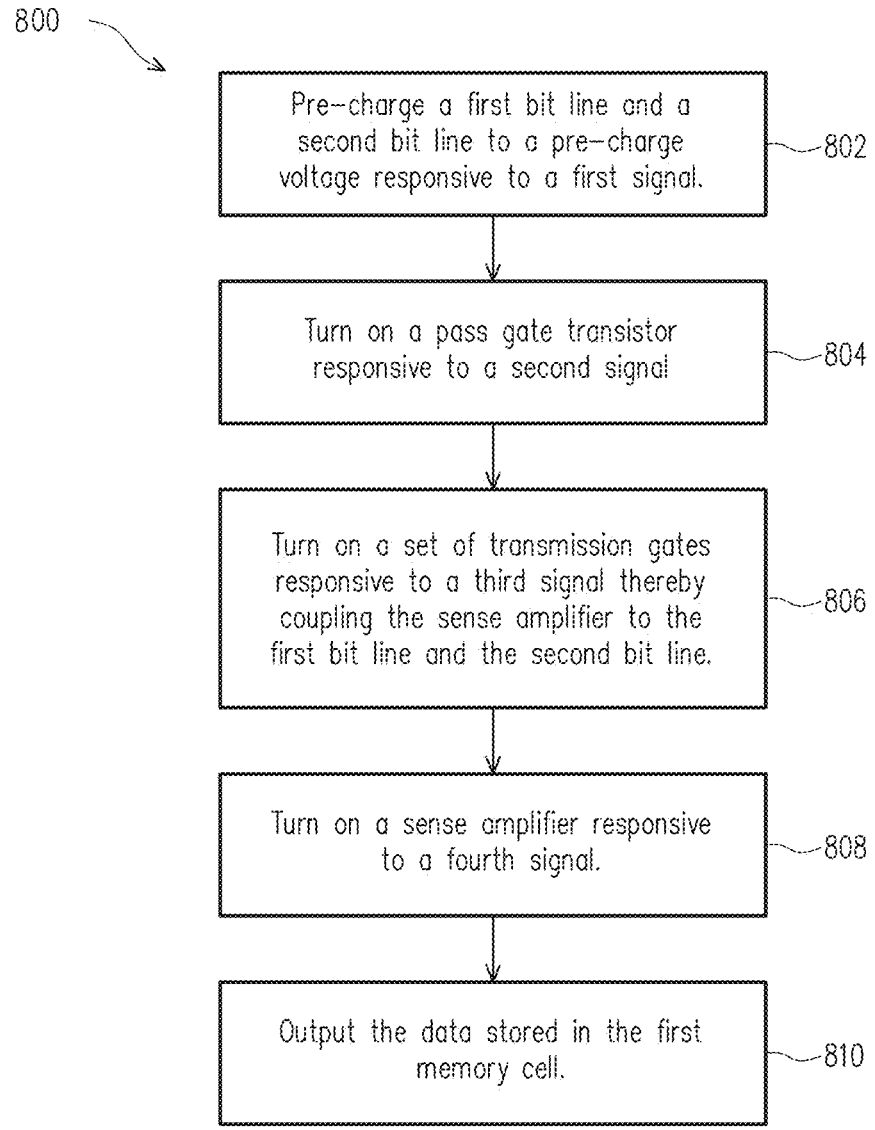
FIG. 8 is a flowchart of a method of reading a data from a memory circuit in accordance with some embodiments.

FIG. 8 is a flowchart of a method 800 of reading a data stored in a memory cell 302[1,1] in memory circuit 300 in accordance with some embodiments. It is understood that additional operations may be performed before, during, and/or after the method 800 depicted in FIG. 8, and that some other operations may only be briefly described herein, and one or more operations in FIG. 8 are omitted.

In some embodiments, method 800 is usable to operate a memory circuit, such as memory circuit 300 (FIG. 3) or memory circuit 400 (FIG. 4). In the following operations, references are made to FIGS. 1-7B.

In operation 802 of method 800, a first bit line BL[1] and a second bit line BL[2] are pre-charged, by a set of pre-charge circuits 304, to a pre-charge voltage Vpc responsive to a first signal (e.g., signal PCH). In some embodiments, the pre-charge voltage is voltage Vpc. In some embodiments, pre-charge voltage Vpc is equal to a supply voltage Vcc minus a threshold voltage Vth of an NMOS transistor N3 of a pre-charge circuit 304[1] or 304[2] of the set of pre-charge circuits 304. In some embodiments, the pre-charge voltage is between a first voltage of a first logical level (e.g., logical low) and a second voltage of a second logical level (e.g., logical high). In some embodiments, the set of pre-charge circuits 304 is coupled to the first bit line BL[1] and the second bit line BL[2]. In some embodiments, the first bit line BL[1] is coupled to memory cell 302[1,1]. In some embodiments, the data stored in memory cell 302[1,1] is the first logical level (e.g., logical low) or the second logical level (e.g., logical high). In some embodiments, the first logical level (e.g., logical low) is different from the second logical level (e.g., logical high).

In some embodiments, operation 802 comprises turning on a first transistor (NMOS N3[1]) of a first type (n-type) responsive to the first signal (e.g., signal PCH) thereby pulling a voltage of the first bit line BL[1] towards the pre-charge voltage Vpc and turning on a second transistor (NMOS N3[2]) of the first type (n-type) responsive to the first signal (e.g., signal PCH) thereby pulling a voltage of the second bit line BL[2] towards the pre-charge voltage Vpc.

In some embodiments, operation 802 further comprises equalizing, by an equalization circuit 306[1] of a set of equalization circuits 306, the voltage of the first bit line BL[1] and the second bit line BL[2] responsive to an equalization signal EQ. In some embodiments, equalizing the voltage of the first bit line BL[1] and the second bit line BL[2] comprises turning on a third transistor (PMOS P4) of a second type (p-type) responsive to an equalization signal EQ thereby coupling the first bit line BL[1] and the second bit line BL[2]. In some embodiments, the second type (p-type) is different from the first type (n-type). In some embodiments, the equalization signal EQ) is different from the first signal (e.g., signal PCH).

In operation 804 of method 800, a pass gate transistor (e.g., PMOS transistor P3) is turned on responsive to a second signal (e.g., word line signal WL). In some embodiments, the second signal (e.g., word line signal WL) is different from the first signal (e.g., signal PCH).

In some embodiments, turning on the pass gate transistor (e.g., PMOS transistor P3) of operation 804 comprises coupling the first bit line BL[1] and a first node ND1 of the first memory cell (e.g., memory cell 302[1,1]), and pulling the pre-charge voltage Vpc of the first bit line BL[1] towards a voltage of the data stored in the first memory cell. In some embodiments, the voltage of the data is the first voltage of the first logical level (e.g., logical low) or the second voltage of the second logical level (e.g., logical high). In some embodiments, pulling the pre-charge voltage Vpc of the first bit line BL[1] towards a voltage of the data stored in the first memory cell comprises pulling a voltage of at least the first bit line BL[1] toward the voltage of the first logical level (e.g., logical low) or the voltage of the second logical level (e.g., logical high).

In operation 806 of method 800, a first transmission gate (e.g., transmission gate 310[1]) and a second transmission gate (e.g., transmission gate 310[2]) are turned on responsive to at least a third signal (e.g., enable signal CS[1]) or a fourth signal (e.g., complementary enable signal CSB[1]), thereby coupling the sense amplifier 310[1] to the first bit line BL[1] and the second bit line BL[2].

In some embodiments, at least the third signal (e.g., enable signal CS[1]) or the fourth signal (e.g., complementary enable signal CSB[1]) is different from another of the first signal (e.g., signal PCH), the second signal (e.g., word line signal WL), the third signal (e.g., enable signal CS[1]) or the fourth signal (e.g., complementary enable signal CSB[1]).

In operation 808 of method 800, a sense amplifier 312[1] is turned on responsive to a fifth signal (e.g., sense amplifier signal SAen). In some embodiments, the fifth signal (e.g., sense amplifier signal SAen) is different from the first signal (e.g., signal PCH), the second signal (e.g., word line signal WL), the third signal (e.g., enable signal CS[1]) and the fourth signal (e.g., complementary enable signal CSB[1]). In some embodiments, the second bit line BL[2] is used as a reference voltage for the sense amplifier 312[1] during a read operation of the first memory cell 302[1,1]) by bit line BL[1].

In operation 810 of method 800, the data stored (e.g., signal Data Out[1]) in the first memory cell (302[1,1]) is output by sense amplifier 312[1]. In some embodiments, outputting the data stored (e.g., signal Data Out[1]) in the first memory cell (302[1,1]) comprises outputting the voltage of the data stored in the first memory cell (302[1,1]).

In some embodiments, one or more of operations 802, 804, 806, 808, 810 or 812 is optional.

In some embodiments, the first memory cell or the second memory cell of method 800 includes one or more memory cells in memory cell 100, memory cell array 200 or memory cell array 302. In some embodiments, the set of pre-charge circuits of method 800 includes one or more pre-charge circuits of set of pre-charge circuits 304. In some embodiments, the equalization circuit of method 800 include one or more equalization circuits of set of equalization circuits 306. In some embodiments, the driver circuit of method 800 includes one or more write driver circuits of the set of write driver circuits 308 or 408. In some embodiments, the first or second transmission gate of method 800 includes one or more transmission gates of set of transmission gates 310 or 410. In some embodiments, the sense amplifier of method 800 includes one or more sense amplifiers of the set of sense amplifiers 312 or sense amplifier 412.

In some embodiments, a circuit (e.g., memory circuit 300 or 400) using method 800 is implemented with a differential sensing configuration resulting in a faster sensing time and a lower signal to noise ratio than other approaches.

In some embodiments, a circuit (e.g., memory circuit 300 or 400) using method 800 is configured to pre-charge the bit line and the reference bit line to the pre-charge voltage Vpc by the pre-charge circuit resulting in a natural pre-charge voltage level compared with other approaches that have pre-charge voltage levels generated from additional circuitry.

In some embodiments, a circuit (e.g., memory circuit 300 or 400) using method 800 is configured to use a PMOS transistor as a pass gate transistor in the corresponding memory cell which allows the PMOS pull-up transistor of the memory cell to pull the bit line to the supply voltage Vcc (e.g., logical high) resulting in a larger bit line split between the bit line and the reference bit line than other approaches thereby causing sense amplifier to better sense the written data than other approaches.

One aspect of this description relates to a memory circuit. The memory circuit includes a first bit line, a second bit line, a first inverter coupled to a first storage node and a second storage node, and a second inverter coupled to the first storage node, the second storage node and the first inverter. In some embodiments, the second storage node is not coupled to any bit line. In some embodiments, the memory circuit further includes a P-type pass gate transistor coupled between the first storage node and the first bit line. In some embodiments, the memory circuit further includes a pre-charge circuit coupled to at least the first bit line or the second bit line. The pre-charge circuit configured to charge at least the first bit line or the second bit line to a pre-charge voltage responsive to a first signal, the pre-charge voltage being between a voltage of a first logical level and a voltage of a second logical level. In some embodiments, the memory circuit further includes a first transmission gate coupled to the first bit line, and configured to receive a first control signal and a second control signal inverted from the first control signal. In some embodiments, the memory circuit further includes a sense amplifier coupled to the first bit line by the first transmission gate.

Another aspect of this description relates to a memory circuit. The memory circuit includes a first bit line, a second bit line, and a first memory cell between the first bit line and the second bit line. In some embodiments, the first memory cell includes a first storage node, a first P-type pass gate transistor coupled between the first storage node and the first bit line, and a second storage node. The memory circuit further includes a first pre-charge circuit having a first N-type transistor coupled to the first bit line, and configured to charge the first bit line to a pre-charge voltage responsive to a first signal. The memory circuit further includes a first transmission gate coupled between the first bit line and a first node of a first set of nodes, and configured to receive a first control signal and a second control signal inverted from the first control signal. The memory circuit further includes a sense amplifier coupled to the first bit line by the first transmission gate.

Still another aspect of this description relates to a method of reading data stored in a first memory cell. The method includes pre-charging, by a set of pre-charge circuits, a first bit line and a second bit line to a pre-charge voltage responsive to a first signal, the pre-charge voltage being between a first voltage of a first logical level and a second voltage of a second logical level, the first bit line being coupled to the first memory cell, the set of pre-charge circuits being coupled to the first bit line and the second bit line, and the data stored in the first memory cell being the first logical level or the second logical level, the set of pre-charge circuits comprising a first pre-charge circuit having a first N-type transistor coupled to the first bit line, and the first memory cell comprising a first P-type pass gate transistor coupled to at least the first bit line. In some embodiments, the method further includes equalizing the pre-charge voltage of the first bit line and the second bit line in response to a second signal different from the first signal. In some embodiments, the method further includes turning on the first P-type pass gate transistor responsive to a third signal different from the first signal and the second signal. In some embodiments, the method further includes turning on a first transmission gate and a second transmission gate responsive to a first control signal and a second control signal inverted from the first control signal, thereby coupling a sense amplifier to the first bit line by the first transmission gate, and coupling the sense amplifier to the second bit line by the second transmission gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory circuit comprising:
a first bit line;
a second bit line;
a first inverter coupled to a first storage node and a second storage node;
a second inverter coupled to the first storage node, the second storage node and the first inverter, the second storage node is not coupled to any bit line;
a P-type pass gate transistor coupled between the first storage node and the first bit line;
a pre-charge circuit coupled to at least the first bit line or the second bit line, the pre-charge circuit configured to charge at least the first bit line or the second bit line to a pre-charge voltage responsive to a first signal, the pre-charge voltage being between a voltage of a first logical level and a voltage of a second logical level;
a first transmission gate coupled to the first bit line, and configured to receive a first control signal and a second control signal inverted from the first control signal; and
a sense amplifier coupled to the first bit line by the first transmission gate.

2. The memory circuit of claim 1, further comprising:
an equalization circuit coupled between the first bit line and the second bit line, the equalization circuit configured to equalize a voltage of the first bit line and a voltage of the second bit line to the pre-charge voltage responsive to a second signal.

3. The memory circuit of claim 2, wherein the equalization circuit comprises:
a first transistor of a first type comprising:
a gate terminal of the first transistor being configured to receive the second signal;
a drain terminal of the first transistor being coupled to the first bit line; and
a source terminal of the first transistor being coupled to the second bit line.

4. The memory circuit of claim 3, wherein the first type is a p-type.

5. The memory circuit of claim 1, wherein the pre-charge circuit includes a first N-type transistor having a first threshold value.

6. The memory circuit of claim 1, further comprising:
a first write driver coupled to the first bit line and the second bit line, the first write driver comprising:
an input terminal configured to receive a data signal; and
an output terminal coupled to the first bit line at a first node, and coupled to the second bit line at a second node.

7. The memory circuit of claim 6, further comprising:
a second transmission gate coupled to the second bit line at the second node, and coupled to the first transmission gate, and configured to receive the first control signal and the second control signal.

8. The memory circuit of claim 7, wherein the sense amplifier is further coupled to the second transmission gate, and further coupled to the second bit line by the second transmission gate.

9. The memory circuit of claim 1, further comprising:
a third inverter having a third storage node;
a fourth inverter having a fourth storage node coupled to the third inverter, the third storage node being coupled to the fourth inverter, the fourth storage node is not coupled to the second bit line; and
another P-type pass gate transistor coupled between the third storage node and the second bit line, and coupled to the third inverter and the fourth inverter.

10. The memory circuit of claim 1, wherein the first inverter, the second inverter and the P-type pass gate transistor are part of a five transistor (5T) static random access memory (SRAM) memory cell.

11. The memory circuit of claim 1, wherein the pre-charge circuit comprises:
a first N-type transistor comprising:
a gate terminal of the first N-type transistor being configured to receive the first signal;
a source terminal of the first N-type transistor being coupled to the first bit line; and
a drain terminal of the first N-type transistor being coupled to at least a first supply voltage.

12. The memory circuit of claim 11, wherein the pre-charge circuit further comprises:
a second N-type transistor comprising:
a gate terminal of the second N-type transistor being configured to receive the first signal;
a source terminal of the second N-type transistor being coupled to the second bit line; and
a drain terminal of the second N-type transistor being coupled to at least the first supply voltage.

13. A memory circuit comprising:
a first bit line;
a second bit line;
a first memory cell between the first bit line and the second bit line, the first memory cell comprising:
   a first storage node;
   a first P-type pass gate transistor coupled between the first storage node and the first bit line; and
   a second storage node;
a first pre-charge circuit having a first N-type transistor coupled to the first bit line, and configured to charge the first bit line to a pre-charge voltage responsive to a first signal;
a first transmission gate coupled between the first bit line and a first node of a first set of nodes, and configured to receive a first control signal and a second control signal inverted from the first control signal; and
a sense amplifier coupled to the first bit line by the first transmission gate.

14. The memory circuit of claim 13, further comprising:
a second memory cell between the first bit line and the second bit line, the second memory cell comprising:
   a third storage node;
   a second P-type pass gate transistor coupled between the third storage node and the second bit line; and
   a fourth storage node.

15. The memory circuit of claim 13, further comprising:
a second transmission gate coupled between the second bit line and a second node of a second set of nodes, and configured to receive the first control signal and the second control signal,
wherein the sense amplifier is further coupled to the second bit line by the second transmission gate.

16. The memory circuit of claim 15, further comprising:
a first write driver comprising:
   a first input terminal configured to receive a first data signal; and
   a first output terminal coupled to the first set of nodes and the first transmission gate; and
a second write driver comprising:
   a second input terminal configured to receive a second data signal; and
   a second output terminal coupled to the second set of nodes and the second transmission gate.

17. A method of reading data stored in a first memory cell, the method comprising:
pre-charging, by a set of pre-charge circuits, a first bit line and a second bit line to a pre-charge voltage responsive to a first signal, the pre-charge voltage being between a first voltage of a first logical level and a second voltage of a second logical level, the first bit line being coupled to the first memory cell, the set of pre-charge circuits being coupled to the first bit line and the second bit line, and data stored in the first memory cell being the first logical level or the second logical level, the set of pre-charge circuits comprising a first pre-charge circuit having a first N-type transistor coupled to the first bit line, and the first memory cell comprising a first P-type pass gate transistor coupled to at least the first bit line;
equalizing the pre-charge voltage of the first bit line and the second bit line in response to a second signal different from the first signal;
turning on the first P-type pass gate transistor responsive to a third signal different from the first signal and the second signal; and
turning on a first transmission gate and a second transmission gate responsive to a first control signal and a second control signal inverted from the first control signal, thereby coupling a sense amplifier to the first bit line by the first transmission gate, and coupling the sense amplifier to the second bit line by the second transmission gate.

18. The method of claim 17, wherein the pre-charging the first bit line and the second bit line comprises:
turning on a first transistor of a first type responsive to the first signal thereby pulling a voltage of the first bit line towards the pre-charge voltage, the first transistor of the first type being the first N-type transistor; and
turning on a second transistor of the first type responsive to the first signal thereby pulling a voltage of the second bit line towards the pre-charge voltage.

19. The method of claim 18, wherein the equalizing the pre-charge voltage of the first bit line and the second bit line comprises:
turning on a third transistor of a second type responsive to the second signal thereby coupling the first bit line and the second bit line, the second type being different from the first type.

20. The method of claim 17, further comprising:
turning on the sense amplifier responsive to a fourth signal, the fourth signal being different from the first signal, the second signal and the third signal.

* * * * *